(12) United States Patent
Kim et al.

(10) Patent No.: US 11,978,394 B2
(45) Date of Patent: May 7, 2024

(54) DISPLAY DEVICE HAVING POWER MANAGEMENT BLOCK

(71) Applicant: Samsung Display Co., Ltd., Yongin-si (KR)

(72) Inventors: Taehoon Kim, Hwaseong-si (KR); Soon-Dong Kim, Osan-si (KR); Jaekeun Lim, Suwon-si (KR); Joon-Chul Goh, Suwon-si (KR); Bonghyun You, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 273 days.

(21) Appl. No.: 17/246,430

(22) Filed: Apr. 30, 2021

(65) Prior Publication Data

US 2021/0407399 A1 Dec. 30, 2021

(30) Foreign Application Priority Data

Jun. 26, 2020 (KR) .................. 10-2020-0078679

(51) Int. Cl.
*G09G 3/3225* (2016.01)
*H10K 59/121* (2023.01)

(52) U.S. Cl.
CPC ......... *G09G 3/3225* (2013.01); *H10K 59/121* (2023.02); *G09G 2330/021* (2013.01)

(58) Field of Classification Search
CPC ........... G09G 3/3225; G09G 2330/021; G09G 2300/0861; G09G 2310/0221; G09G 2310/0262; G09G 2310/061; G09G 3/035; G09G 2310/04; G09G 2310/06; G09G 2380/02; G09G 3/3266; G09G 3/3233; G09G 3/3208; H10K 59/121; H10K 59/12

See application file for complete search history.

(56) References Cited

U.S. PATENT DOCUMENTS

| 2016/0240146 | A1* | 8/2016 | Lee | G09G 3/2003 |
| 2018/0102096 | A1* | 4/2018 | Lee | G09G 3/035 |
| 2018/0144688 | A1* | 5/2018 | Lee | G09G 3/3266 |
| 2020/0082768 | A1* | 3/2020 | Oh | G09G 3/3291 |

FOREIGN PATENT DOCUMENTS

| KR | 10-2018-0057101 A | 5/2018 |
| KR | 10-2019-0139355 A | 12/2019 |
| KR | 10-2067240 B1 | 1/2020 |
| KR | 10-2020-0144632 A | 12/2020 |

\* cited by examiner

*Primary Examiner* — Stephen G Sherman
(74) *Attorney, Agent, or Firm* — Lewis Roca Rothgerber Christie LLP

(57) ABSTRACT

A display device includes: a first partial emission driver configured to provide first emission control signals to a first partial panel area of the display panel, and a second partial emission driver configured to provide second emission control signals to a second partial panel area of the display panel; and a power management block configured to: provide a first voltage and a second voltage to the emission driver, in response to the first partial emission driver generating the first emission control signals; and provide a third voltage and a fourth voltage to the emission driver in response to the second partial emission driver generating the second emission control signals; and an emission control block configured to receive the first voltage and the second voltage from the power management block and to provide a first clock signal and a second clock signal to the emission driver.

22 Claims, 16 Drawing Sheets

DISPLAY DEVICE HAVING POWER MANAGEMENT BLOCK

CROSS-REFERENCE TO RELATED APPLICATION(S)

The present application claims priority to and the benefit of Korean Patent Application No. 10-2020-0078679, filed on Jun. 26, 2020, which is hereby incorporated by reference for all purposes as if fully set forth herein.

BACKGROUND

1. Field

Aspects of some example embodiments of the present disclosure relate generally to a display panel and a display device including the same.

2. Discussion of the Background

While a user uses a display device, moving images (e.g., video) may be displayed in a first partial panel area, and still images (e.g., static images) may be displayed in a second partial panel area. Alternatively, the first partial panel area may be driven at a high driving frequency corresponding to an image displayed in the first partial panel area, and the second partial panel area may be driven at a low driving frequency corresponding to an image displayed in the second partial panel area. However, the conventional display device has a disadvantage in that power consumption cannot be reduced as the entire area of the display panel is driven with the same driving frequency.

The above information disclosed in this Background section is only for understanding of the background of the inventive concepts, and, therefore, it may contain information that does not constitute prior art.

SUMMARY

Aspects of some example embodiments of the present disclosure relate generally to a display panel and a display device including the same. For example, aspects of some example embodiments of the invention relate to the display panel including connecting lines.

Aspects of some example embodiments include a display device capable of reducing power consumption.

A display device according to some example embodiments includes: a display panel including a plurality of pixels, an emission driver including a first partial emission driver and a second partial emission driver, wherein the first partial emission driver provides a first emission control signals to a first partial panel area of the display panel, and wherein the second partial emission driver provides a second emission control signals to a second partial panel area of the display panel, and a controller which controls the emission driver. The controller may comprise a power management block which provides a first voltage having a high level and a second voltage having a low level to the emission driver while the first partial emission driver generates the first emission control signals and provides a third voltage and a fourth voltage having a same level as the third voltage to the emission driver while the second partial emission driver generates the second emission control signals and an emission control block which receives the first voltage and the second voltage from the power management block and provides a first clock signal and a second clock signal to the emission driver based on the first and second voltages.

According to some example embodiments, a first driving frequency of the first partial panel area may be greater than the second driving frequency of the second partial panel area.

According to some example embodiments, the third voltage and the fourth voltage may have the low level.

According to some example embodiments, the third voltage and the fourth voltage may have the high level.

According to some example embodiments, the emission control block may provide an emission start signal having the high level to the emission driver, the first emission control signals may be sequentially changed to the high level, and the second emission control signals may not be changed to the high level.

According to some example embodiments, the emission control block may provide the first and second clock signals having the high level to the emission driver while the second partial emission driver generates the second emission control signals.

According to some example embodiments, the emission control block may provide the first and second clock signals to the emission driver while the first partial emission driver generates the first emission control signals. The first and second clock signals may toggle between the high level and the low level and may have different phases each other.

According to some example embodiments, the second partial emission driver may include a plurality of circuit stages. At least one circuit stages may comprise a first switching element which transmits the third voltage to an output terminal in response to a signal of a first node, and a second switching element which transmits the fourth voltage to the output terminal in response to a signal of a second node. The output terminal may output the second emission control signals.

According to some example embodiments, at least one circuit stages may further comprise a third switching element which transmits the first emission control signals to the second node in response to the first clock signal.

According to some example embodiments, at least one circuit stages may further comprise a fifth switching element which transmits the third voltage to the first node in response to the signal of the second node.

A display device according to some example embodiments includes: a display panel including a plurality of pixels, an emission driver including a first partial emission driver and a second partial emission driver, wherein the first partial emission driver provides a first emission control signals to a first partial panel area of the display panel, and wherein the second partial emission driver provides a second emission control signals to a second partial panel area of the display panel, and a controller which controls the emission driver. The first partial emission driver may comprise a plurality of first circuit stages and the second partial emission driver may comprise a plurality of second circuit stages. The controller may comprise a power management block which provides a first voltage having a high level and a second voltage having a low level to the first circuit stages while the first partial emission driver generates the first emission control signals, provides a third voltage and a fourth voltage having a same level as the third voltage to a first circuit stage among the second circuit stages while the second partial emission driver generates the second emission control signals, and provides the first voltage and the second voltage to other circuit stages among the second circuit stages while the second partial emission driver generates the second emission control signals and an emission control block which receives the first voltage and the second voltage from the power management block and provides a first clock signal and a second clock signal to the emission driver based on the first and second voltages.

According to some example embodiments, a first driving frequency of the first partial panel area may be greater than the second driving frequency of the second partial panel area.

According to some example embodiments, the third voltage and the fourth voltage may have the low level.

According to some example embodiments, the third voltage and the fourth voltage may have the high level.

According to some example embodiments, the emission control block may provide an emission start signal having the high level to the emission driver, the first emission control signals may be sequentially changed to the high level, and the second emission control signals may not be changed to the high level.

According to some example embodiments, the emission control block may provide the first and second clock signals having the high level to the emission driver while the second partial emission driver generates the second emission control signals.

According to some example embodiments, the emission control block may provide the first and second clock signals to the emission driver while the first partial emission driver generates the first emission control signals. The first and second clock signals may toggle between the high level and the low level and may have different phases each other.

According to some example embodiments, the first circuit stage among the second circuit stages may comprise a first switching element which transmits the third voltage to an output terminal in response to a signal of a first node and a second switching element which transmits the fourth voltage to the output terminal in response to a signal of a second node. The output terminal may output the second emission control signals.

According to some example embodiments, the first circuit stage among the second circuit stages may further comprise a third switching element which transmits the first emission control signals to the second node in response to the first clock signal.

According to some example embodiments, the first circuit stage among the second circuit stages may further comprise a fifth switching element which transmits the third voltage to the first node in response to the signal of the second node.

Therefore, the display device according to some example embodiments may divide a display panel into a plurality of partial panel areas and may drive the partial panel areas at different driving frequencies. Because the display device includes partial emission drivers that provide emission control signals to the partial panel areas, respectively, power consumption of the display device may be reduced.

It is to be understood that both the foregoing general description and the following detailed description are merely examples and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate example embodiments of the invention, and together with the description serve to explain the inventive concepts.

DETAILED DESCRIPTION

Illustrative, non-limiting example embodiments will be more clearly understood from the following detailed description in conjunction with the accompanying drawings.

Figure 1:
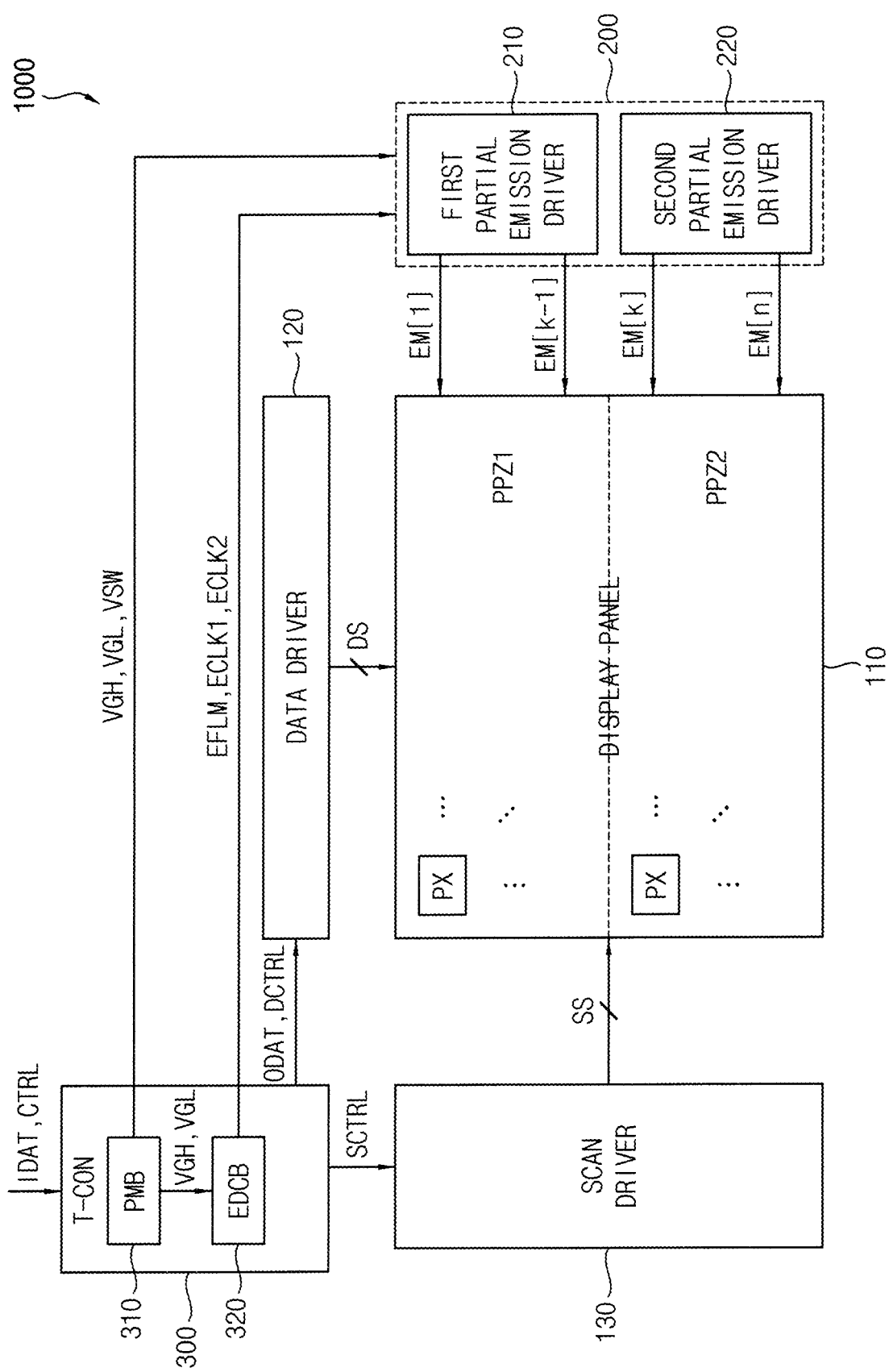
FIG. 1 is a block diagram illustrating a display device according to some example embodiments.
Figure 2:
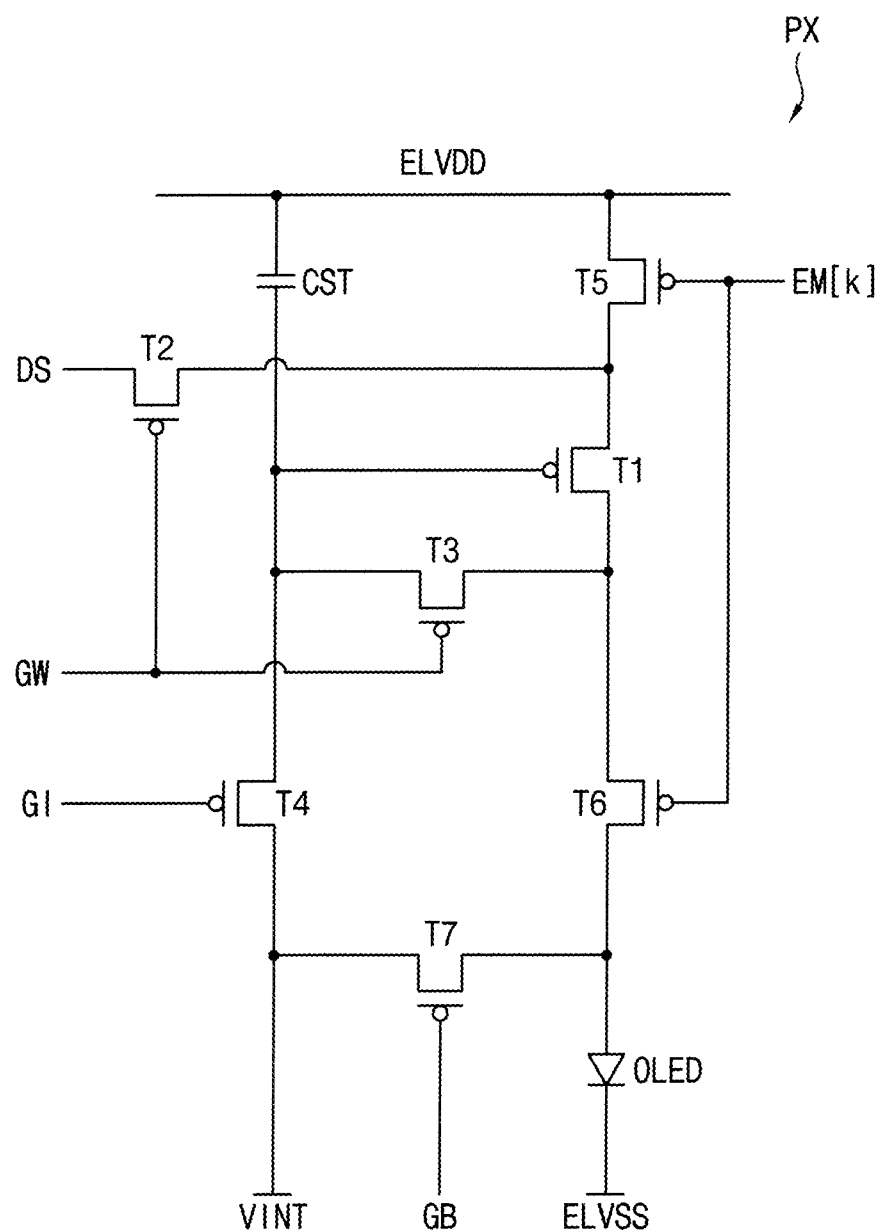
FIG. 2 is a circuit diagram illustrating a pixel included in the display device of FIG. 1 according to some example embodiments.
Figure 3:
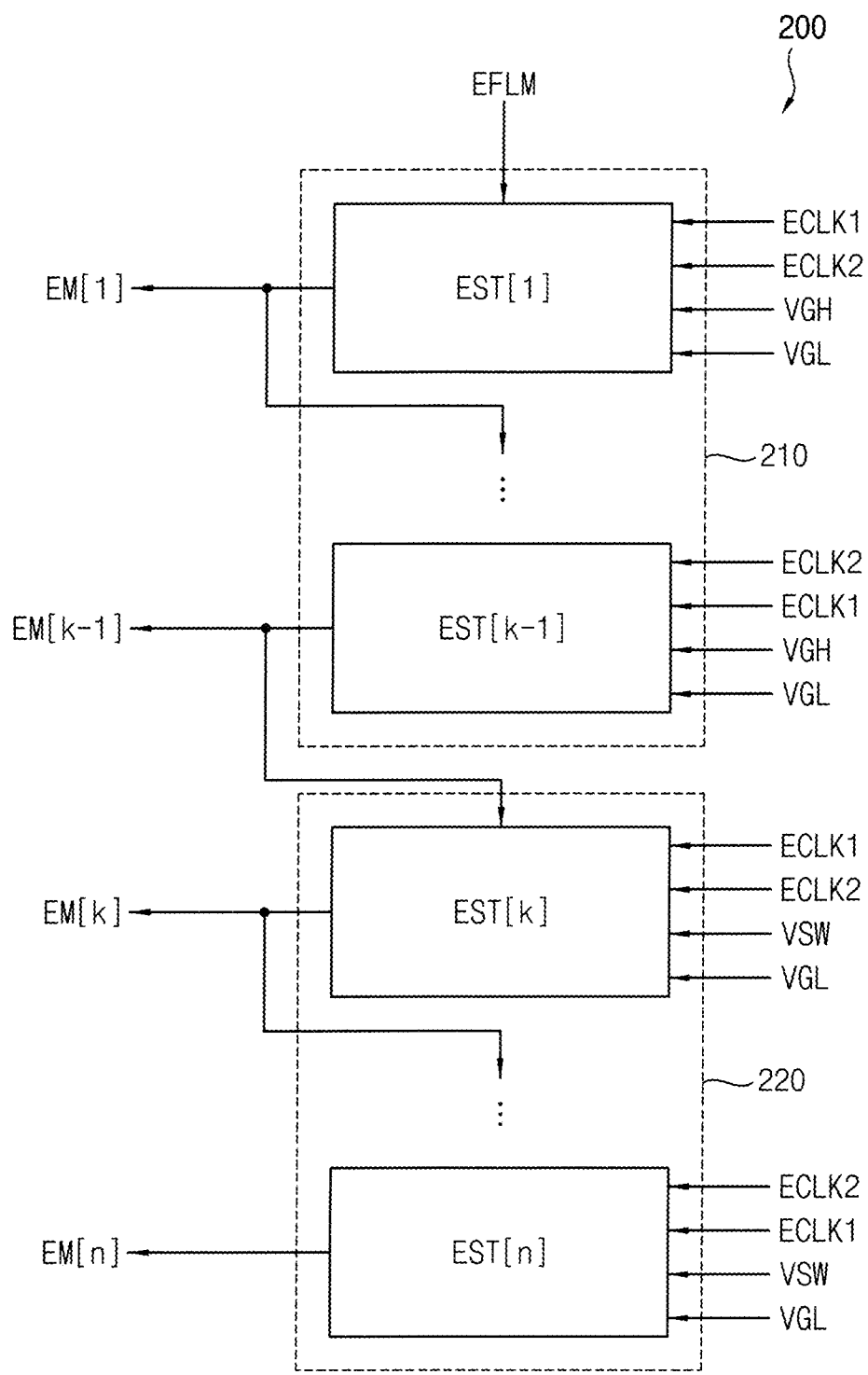
FIG. 3 is a block diagram illustrating an example of an emission driver included in the display device of FIG. 1 according to some example embodiments.
Figure 4:
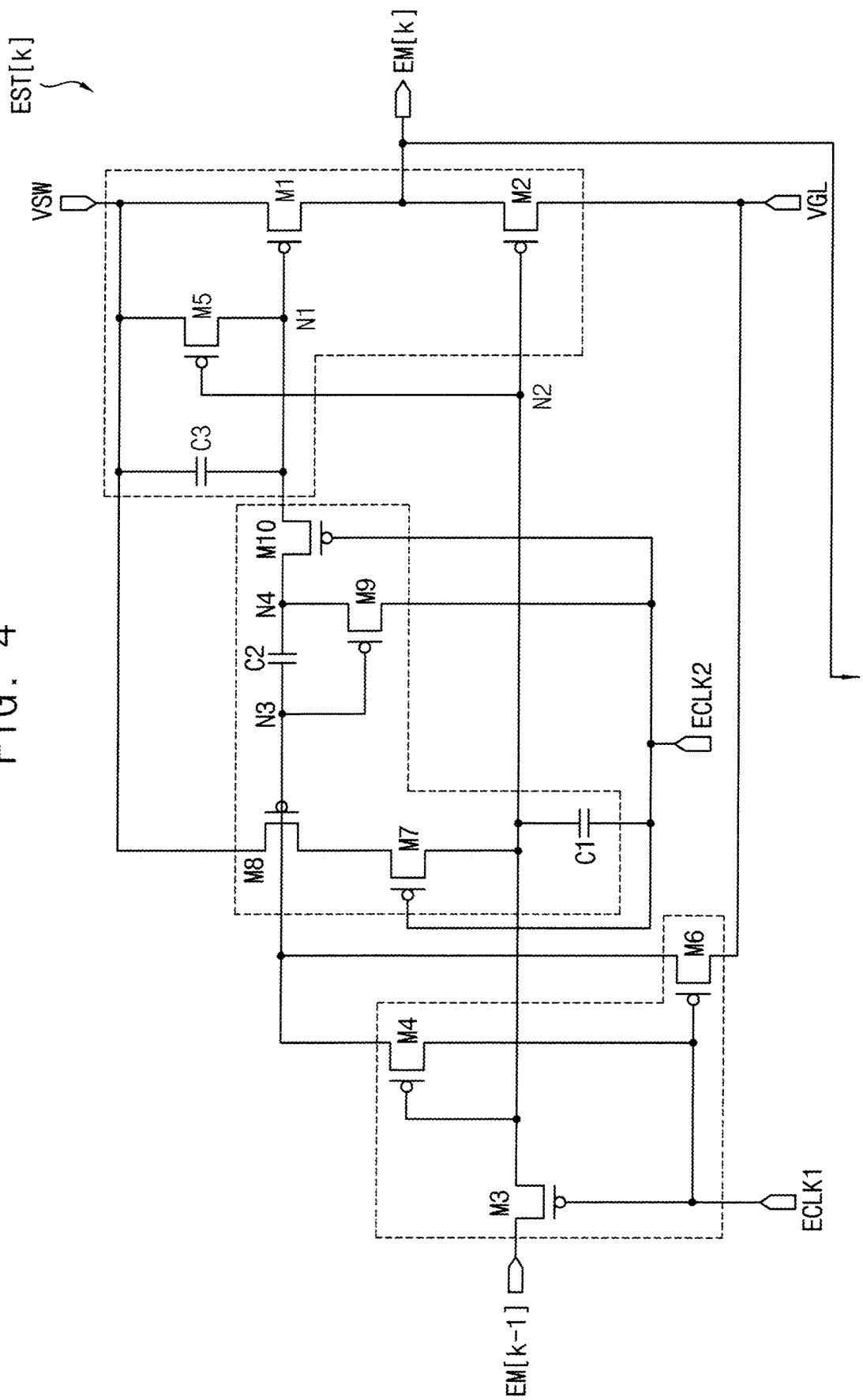
FIG. 4 is a circuit diagram illustrating a (k)-th circuit stage included in the emission driver of FIG. 3 according to some example embodiments.
Figure 5:
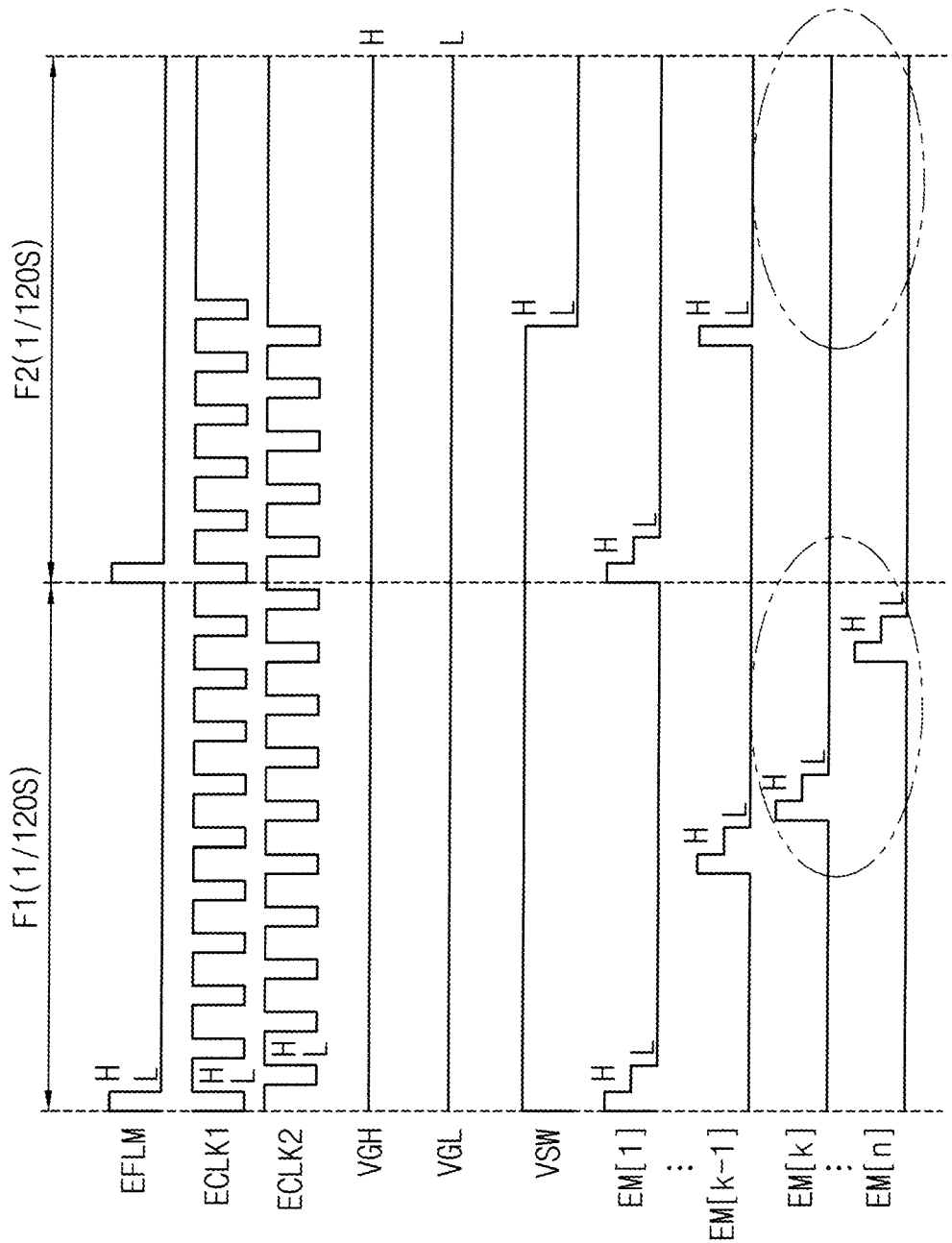
FIG. 5 is a waveform diagram illustrating a method of driving the emission driver of FIG. 3 according to some example embodiments.

FIG. 1 is a block diagram illustrating a display device according to some example embodiments. FIG. 2 is a circuit diagram illustrating a pixel included in the display device of FIG. 1. FIG. 3 is a block diagram illustrating an example of an emission driver included in the display device of FIG. 1. FIG. 4 is a circuit diagram illustrating a (k)-th circuit stage included in the emission driver of FIG. 3. FIG. 5 is a waveform diagram illustrating a method of driving the emission driver of FIG. 3.

Referring to FIG. 1, a display device 1000 according to some example embodiments may include a display panel 110, a data driver 120, a scan driver 130, an emission driver 200, and a controller 300.

The display panel 110 may include a plurality of data lines, a plurality of scan lines, a plurality of emission lines, and a plurality of pixels PX. The pixels PX may be electrically connected to the data lines, the scan lines, and the emission lines.

Referring to FIG. 2, each of the pixels PX may include a plurality of transistors, a storage capacitor CST, and an organic light emitting diode OLED.

A first transistor T1 may generate a driving current. A second transistor T2 may transmit a data signal DS provided from the data driver 120 to a source electrode of the first transistor T1 in response to a first scan signal GW provided from the scan driver 130. A third transistor T3 may diode-connect the first transistor T1 in response to the first scan signal GW. The storage capacitor CST may store the data signal DS. The fourth transistor T4 may transmit the initialization voltage VINT to A gate electrode of the first transistor T1 in response to a second scan signal GI provided from the scan driver 130. A fifth transistor T5 may provide a high power voltage ELVDD to the source electrode of the first transistor T1 in response to an emission control signal EM provided from the emission driver 200. A sixth transistor T6 may connect a drain electrode of the first transistor T1 to the organic light emitting diode OLED in response to the emission control signal EM. A seventh transistor T7 may provide the initialization voltage VINT to the organic light emitting diode OLED in response to a third scan signal GB provided by the scan driver 130. The organic light emitting diode OLED may emit light based on the driving current.

Each of the first to seventh transistors T1, T2, T3, T4, T5, T6, and T7 may be a PMOS transistor or an NMOS transistor. According to some example embodiments, each of the fifth and sixth transistors T5 and T6 may be a PMOS transistor. In this case, when the emission control signal EM has a voltage of a high level H, the fifth and sixth transistors T5 and T6 may be turned off, and when the emission control signal EM has a voltage of a low level L, the fifth and sixth transistors T5 and T6 may be turned on.

Referring back to FIG. 1, the data driver 120 may generate data signals DS based on an output image data ODAT and a data control signal DCTRL received from the controller 300, and may provide the data signals DS to the pixels PX through the data lines. According to some example embodiments, the data control signal DCTRL may include an output data enable signal, a horizontal start signal, and a load signal, but is not limited thereto.

The scan driver 130 may generate scan signals SS based on the scan control signal SCTRL received from the controller 300, and may provide the scan signals SS to the pixels PX through the scan lines. According to some example embodiments, the scan driver 130 may sequentially provide the scan signals SS to the pixels PX in row units. For example, the scan driver 130 may be integrated or formed in a peripheral portion of the display panel 110.

The emission driver 200 may generate emission control signals EM[1], EM[k−1], EM[k], and EM[n] (wherein k and n are 1<k<n) based on a first voltage VGH, a second voltage VGL, a third voltage VSW, an emission start signal EFLM, a first clock signal ECLK1, and a second clock signal ECLK2 which are received from the controller 300. In addition, the emission driver 200 may provide the emission control signals EM[1], EM[k−1], EM[k], and EM[n] to the pixels PX through the emission lines.

According to some example embodiments, the emission driver 200 may sequentially provide the emission control signals EM[1], EM[k−1], EM[k], and EM[n] to the pixels PX in a row unit. For example, the emission driver 200 may be integrated or formed in a peripheral portion of the display panel 110.

According to some example embodiments, the emission driver 200 may include a first partial emission driver 210 and a second partial emission driver 220. The emission control signals EM[1], EM[k−1], EM[k], and EM[n] may include first emission control signals EM[1] to EM[k−1] and the second emission control signals EM[k] to EM[n]. For example, the first partial emission driver 210 may provide the first emission control signals EM[1] to EM[k−1] to a first partial panel area PPZ1 of the display panel 110. The second partial emission driver 220 may provide the second emission control signals EM[k] to EM[n] to a second partial panel area PPZ2 of the display panel 110.

The controller 300 may receive an input image data IDAT and a control signal CTRL from an external device. According to some example embodiments, the control signal CTRL may include a vertical synchronization signal, a horizontal synchronization signal, an input data enable signal, a master clock signal, and the like. The controller 300 may generate the output image data ODAT, the data control signal DCTRL, the scan control signal SCTRL, the first voltage VGH, the second voltage VGL, the third voltage VSW, the emission start signal EFLM, the first clock signal ECLK1, and the second clock signal ECLK2 based on the input image data IDAT and the control signal CTRL.

The display device 1000 may perform multi-frequency driving ("MFD") driving the first and second partial panel areas PPZ1 and PPZ2 of the display panel 110 at different driving frequencies. For example, the pixels PX located in the first partial panel area PPZ1 may be driven at a first driving frequency, and the pixels PX located in the second partial panel area PPZ2 may be driven at a second driving frequency. According to some example embodiments, the first driving frequency may be smaller than the second driving frequency. For example, the first driving frequency may be about 120 Hz, and the second driving frequency may be about 60 Hz. Accordingly, in order to reduce power consumption of the display device 1000, the controller 300 may include a power management block 310 and an emission control block 320.

The power management block 310 may provide the first voltage VGH having the high level H and the second voltage VGL having the low level L to the emission driver 200 while the first partial emission driver 210 generates the first emission control signals EM[1] to EM[k−1]. In addition, the power management block 310 may provide the third voltage VSW having the low level L and the second voltage VGL having a same level as the third voltage VSW to the emission driver 200 while the second partial emission driver 220 generates the second emission control signals EM[k] to EM[n]. In addition, the power management block 310 may provide the first voltage VGH and the second voltage VGL to the emission control block 320.

The emission control block 320 may receive the first and second voltages VGH and VGL from the power management block 310, and may provide the first clock signal ECLK1 and the second clock signal ECLK2 based on the first and second voltages VGH and VGL to the emission driver 200.

For example, the emission control block 320 may provide the first and second clock signals ECLK1 and ECLK2 to the emission driver 200 while the first partial emission driver 210 generates the first emission control signals EM[1] to EM[k−1]. In this case, the first and second clock signals ECLK1 and ECLK2 may toggle between the high level H and the low level L and may have different phases each other. In addition, the emission control block 320 may provide the first and second clock signals ECLK1 and ECLK2 to the emission driver 200 while the second partial emission driver 220 generates the second emission control signals EM[k] to EM[n]. In this case, the first and second clock signals ECLK1 and ECLK2 may have the high level H.

Referring to FIG. 3, the emission driver 200 may include a plurality of circuit stages. The circuit stages may be dependently connected to each other to sequentially provide the emission control signals in row units. For example, the first partial emission driver 210 may include a first circuit stage EST[1] to a (k−1)-th circuit stage EST[k−1], and the second partial emission driver 220 may include a (k)-th circuit stage EST[k] to an (n)-th circuit stage EST[n].

The first circuit stage EST[1] may generate the emission control signal EM[1] by receiving the emission start signal EFLM, the first clock signal ECLK1, the second clock signal ECLK2, the first voltage VGH, and the second voltage VGL. The emission control signal EM[1] may be provided to pixels located in a first pixel row (e.g., a first pixel row among pixel rows of the display panel 110) and may be provided to a second circuit stage.

The (k−1)-th circuit stage EST[k−1] may generate the emission control signal EM[k−1] by receiving an emission control signal from a previous circuit stage, the second clock signal ECLK2, the first clock signal ECLK1, the first voltage VGH, and the second voltage VGL. The emission control signal EM[k−1] may be provided to pixels located in a (k−1)-th pixel row and may be provided to the (k)-th circuit stage EST[k].

The (k)-th circuit stage EST[k] may generate the emission control signal EM[k] by receiving the emission control signal EM[k−1] from a previous circuit stage, the first clock signal ECLK1, the second clock signal ECLK2, the third voltage VSW, and the second voltage VGL. The emission control signal EM[k] may be provided to pixels located in a (k)-th pixel row and may be provided to a (k+1)-th circuit stage.

The (n)-th circuit stage EST[n] may generate the emission control signal EM[n] by receiving an emission control signal from a previous circuit stage, the second clock signal ECLK2, the first clock signal ECLK1, the third voltage VSW, and the second voltage VGL. The emission control signal EM[n] may be provided to pixels located in a (n)-th pixel row.

Referring to FIG. 4, the (k)-th circuit stage EST[k] may output the emission control signal EM[k] by receiving the emission control signal EM[k−1], the third voltage VSW, the second voltage VGL, the first clock signal ECLK1, and the second clock signal ECLK2.

The (k)-th circuit stage EST[k] may include an output unit that controls the level of the emission control signal EM[k]. The output unit may include a first switching element M1, a second switching element M2, a fifth switching element M5, and a third capacitor C3.

The first switching element M1 may transmit the third voltage VSW to an output terminal, through which the emission control signal EM[k] is output, in response to a signal of the first node N1. The second switching element M2 may transmit the second voltage VGL to the output terminal, through which the emission control signal EM[k] is output, in response to a signal of a second node N2. The fifth switching element M5 may control a connection between the third voltage VSW and the first node N1 in response to a signal of the second node N2. The third capacitor C3 may be connected between the third voltage VSW and the first node N1. The third capacitor C3 may charge the voltage provided to the first node N1.

The (k)-th circuit stage EST[k] may include a first driving unit that controls a signal provided to the second node N2. The first driving unit may include a third switching element M3, a fourth switching element M4, and a sixth switching element M6.

The third switching element M3 may transmit the emission control signal EM[k−1] to the second node N2 in response to the first clock signal ECLK1. The fourth switching element M4 may control a connection between the first clock signal ECLK1 and the first node N1 in response to the signal from the second node N2. The sixth switching element M6 may control a connection between the fourth voltage VGL and the first node N1 in response to the first clock signal ECLK1.

The (k)-th circuit stage EST[k] may include a second driving unit that controls a signal provided to the first node N1. The second driving unit may include a seventh switching element M7, an eighth switching element M8, a ninth switching element M9, a tenth switching element M10, a first capacitor C1, and a second capacitor C2.

The seventh and eighth switching elements M7 and M8 may be connected in series between the second node N2 and the third voltage VSW. The seventh switching element M7 may control a connection between the eighth switching element M8 and the second node N2 in response to the second clock signal ECLK2. The eighth switching element M8 may control a connection between the third voltage VSW and the second node N2 in response to a signal of the third node N3. The ninth switching element M9 may control a connection between the second clock signal ECLK2 and the fourth node N4 in response to the signal of the third node N3. The tenth switching element M10 may control a connection between the fourth node N4 and the first node N1 in response to the second clock signal ECLK2. The first capacitor C1 may be connected between the second clock signal ELCK2 and the second node N2, and the second capacitor C2 may be connected to the third node N3 and the fourth node N4.

Referring to FIGS. 1, 3, 4, and 5, the display device 1000 may be driven during a first frame F1 and a second frame F2 following the first frame F1. According to some example embodiments, the first partial panel area PPZ1 may be driven at the first driving frequency, and the second partial panel area PPZ2 may be driven at the second driving frequency smaller than the first driving frequency. For example, the first driving frequency may be about 120 Hz, and the second driving frequency may be about 60 Hz. In other words, each of the first and second frames F1 and F2 may have a time length of 1/120 second. In order to drive the first partial panel area PPZ1 at the first driving frequency of about 120 Hz, the emission control signals sequentially changed to the high level H during the first and second frames F1 and F2 may be provided to the first partial panel area PPZ1. In order to drive the second partial panel area PPZ2 at the second driving frequency of about 60 Hz, the emission control signals sequentially changed to the high level H during the first frame F1 may be provided to the second partial panel area PPZ2, and the emission control signals that do not change to the high level H during the second frame F2 may be provided to the second partial panel area PPZ2.

During the first frame F1, the emission start signal EFLM having the high level H may be provided to the first circuit stage EST[1]. In addition, the first and second clock signals ECLK1 and ECLK2, which toggle between the high level H and the low level L and have different phases, may be provided to the emission driver 200. In addition, the first voltage VGH having the high level H and the second voltage VGL having the low level L may be provided to the emission driver 200. Accordingly, the emission driver 200 may generate the emission control signals EM[1], EM[k−1], EM[k], and EM[n]. The emission control signals EM[1], EM[k−1], EM[k], and EM[n] may be sequentially changed to the high level H.

While the first partial area PPZ1 is driven of the second frame F2, the emission start signal EFLM having the high level H may be provided to the first circuit stage EST[1]. In addition, the first and second clock signals ECLK1 and ECLK2, which toggle between the high level H and the low level L and have different phases, may be provided to the first partial emission driver 210. In addition, the first voltage VGH having the high level H and the second voltage VGL having the low level L may be provided to the first partial emission driver 210. Accordingly, the first partial emission driver 210 may generate the first emission control signals EM[1] to EM[k−1]. The first emission control signals EM[1] to EM[k−1] may be sequentially changed to the high level H.

While the second partial panel area PPZ2 is driven of the second frame F2, the first and second clock signals ECLK1 and ECLK2 having the high level H may be provided to the second partial emission driver 220. In addition, the third voltage VSW having the low level L and the second voltage VGL having the same level as the third voltage VSW may be provided to the second partial emission driver 220. Accordingly, the second partial emission driver 220 may generate the second emission control signals EM[k] and EM[n]. Because the first and second clock signals ECLK1 and ECLK2 have the high level H and the third and second voltages VSW and VGL have the same level, the second emission control signals EM[k] to EM[n] may not be changed to the high level H.

Figure 6:
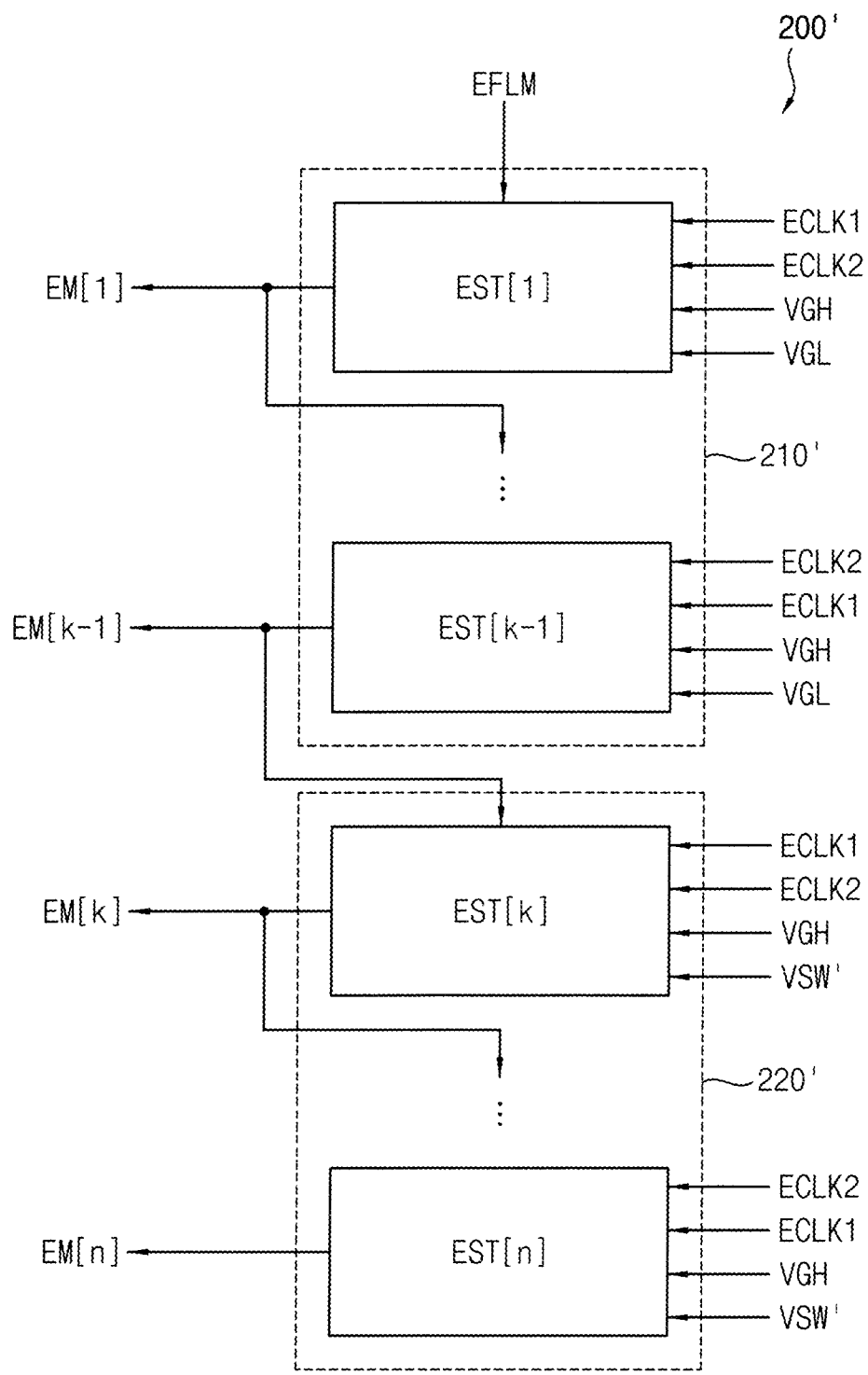
FIG. 6 is a block diagram illustrating another example of an emission driver included in the display device of FIG. 1 according to some example embodiments.
Figure 7:
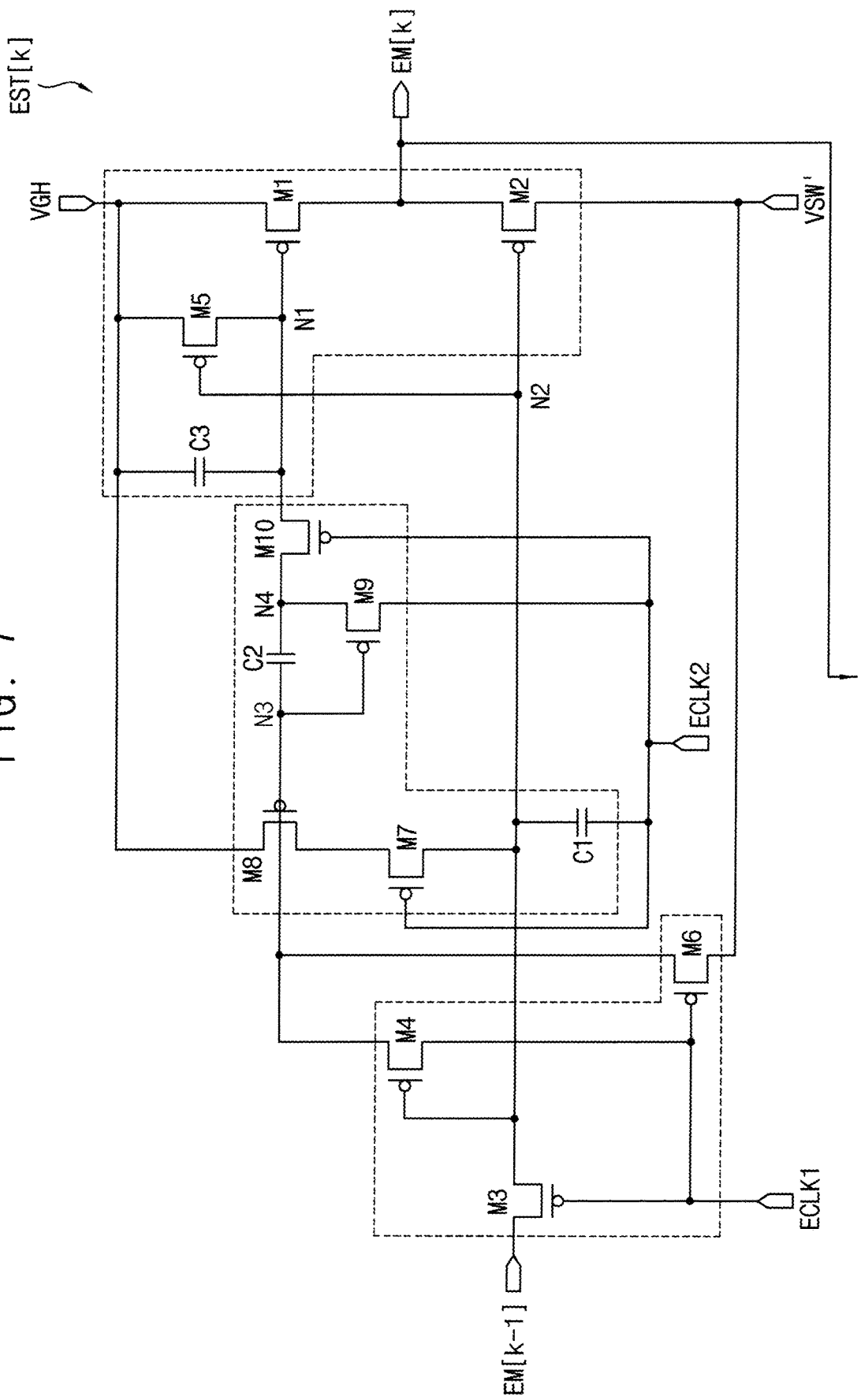
FIG. 7 is a circuit diagram illustrating a (k)-th circuit stage included in the emission driver of FIG. 6 according to some example embodiments.
Figure 8:
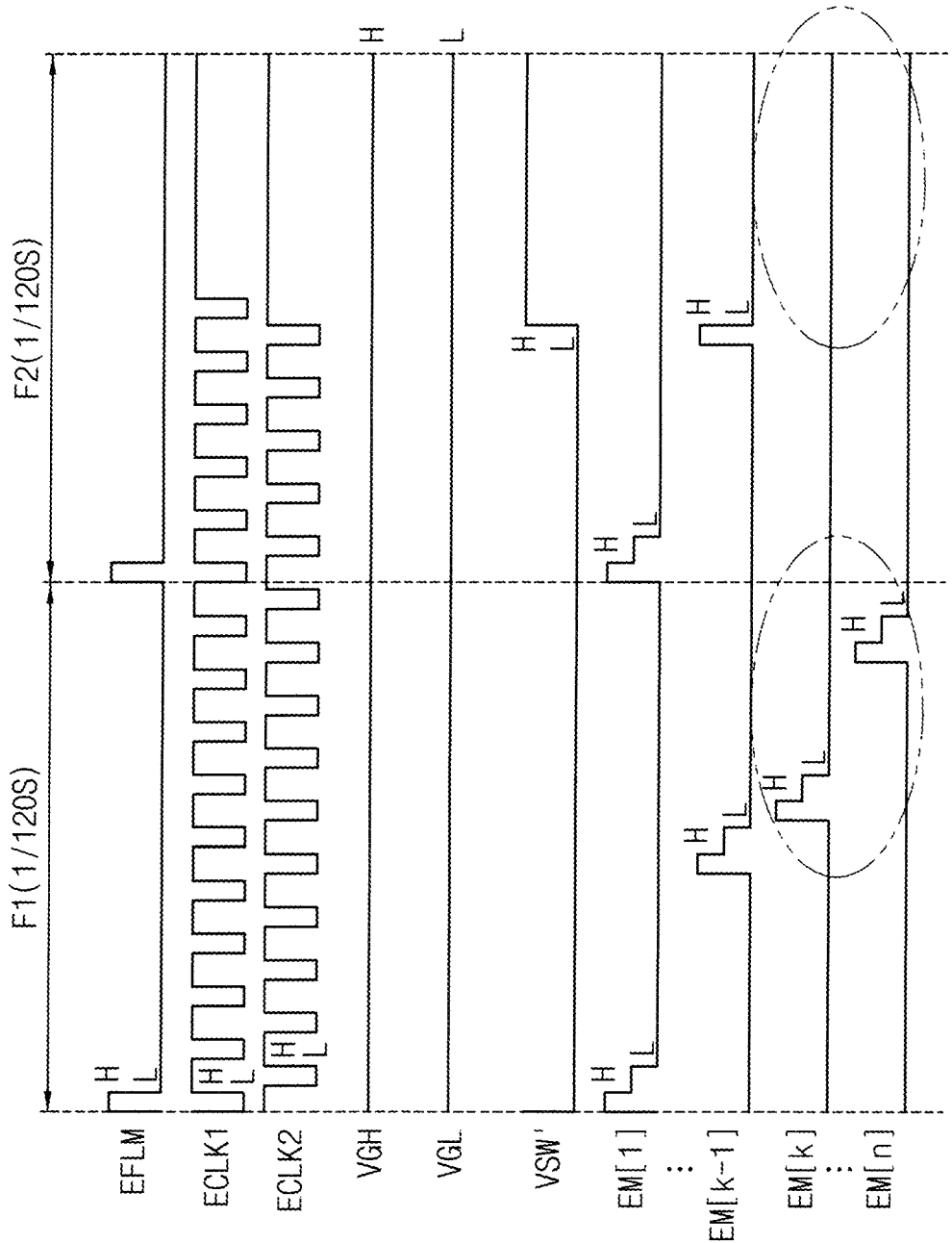
FIG. 8 is a waveform diagram illustrating a method of driving the emission driver of FIG. 6 according to some example embodiments.

FIG. 6 is a block diagram illustrating another example of an emission driver included in the display device of FIG. 1. FIG. 7 is a circuit diagram illustrating a (k)-th circuit stage included in the emission driver of FIG. 6. FIG. 8 is a waveform diagram illustrating a method of driving the emission driver of FIG. 6.

Referring to FIG. 6, an emission driver 200' may include a plurality of circuit stages. The circuit stages may be dependently connected to each other to sequentially provide emission control signals in row units. For example, a first partial emission driver 210' may include a first circuit stage EST[1] to a (k−1)-th circuit stage EST[k−1], and a second partial emission driver 220' may include a (k)-th circuit stage EST[k] to an (n)-th circuit stage EST[n].

The first circuit stage EST[1] may generate an emission control signal EM[1] by receiving the emission start signal EFLM, the first clock signal ECLK1, the second clock signal ECLK2, the first voltage VGH, and the second voltage. The emission control signal EM[1] may be provided to pixels located in a first pixel row (e.g., a first pixel row among pixel rows of the display panel 110) and may be provided to a second circuit stage.

The (k−1)-th circuit stage EST[k−1] may generate an emission control signal EM[k−1] by receiving an emission control signal from a previous circuit stage, the second clock signal ECLK2, the first clock signal ECLK1, the first voltage VGH, and the second voltage VGL. The emission control signal EM[k−1] may be provided to pixels located in a (k−1)-th pixel row and may be provided to the (k)-th circuit stage EST[k].

The (k)-th circuit stage EST[k] may generate an emission control signal EM[k] by receiving the emission control signal EM[k−1] from a previous circuit stage, the first clock signal ECLK1, the second clock signal ECLK2, the first voltage VGH, and a third voltage VSW'. The emission control signal EM[k] may be provided to pixels located in a (k)-th pixel row and may be provided to a (k+1)-th circuit stage.

The (n)-th circuit stage EST[n] may generate the emission control signal EM[n] by receiving an emission control signal from a previous circuit stage, the second clock signal ECLK2, the first clock signal ECLK1, the first voltage VGH, and the third voltage VSW'. The emission control signal EM[n] may be provided to pixels located in a (n)-th pixel row.

Referring to FIG. 7, the (k)-th circuit stage EST[k] may output the emission control signal EM[k] by receiving the emission control signal EM[k−1], the first voltage VGH, the third voltage VSW', the first clock signal ECLK1, and the second clock signal ECLK2.

The (k)-th circuit stage EST[k] may include an output unit that controls the level of the emission control signal EM[k]. The output unit may include a first switching element M1, a second switching element M2, a fifth switching element M5, and a third capacitor C3.

The first switching element M1 may transmit the first voltage VGH to an output terminal, through which the emission control signal EM[k] is output, in response to a signal of a first node N1. The second switching element M2 may transmit the third voltage VSW' to the output terminal, through which the emission control signal EM[k] is output, in response to a signal of a second node N2. The fifth switching element M5 may control a connection between the first voltage VGH and the first node N1 in response to a signal of the second node N2. The third capacitor C3 may be connected between the first voltage VGH and the first node N1. The third capacitor C3 may charge the voltage provided to the first node N1.

The (k)-th circuit stage EST[k] may include a first driving unit that controls a signal provided to the second node N2. The first driving unit may include a third switching element M3, a fourth switching element M4, and a sixth switching element M6.

The third switching element M3 may transmit the emission control signal EM[k−1] to the second node N2 in response to the first clock signal ECLK1. The fourth switching element M4 may control a connection between the first clock signal ECLK1 and the first node N1 in response to the signal from the second node N2. The sixth switching element M6 may control a connection between the third voltage VSW' and the first node N1 in response to the first clock signal ECLK1.

The (k)-th circuit stage EST[k] may include a second driving unit that controls a signal provided to the first node N1. The second driving unit may include a seventh switching element M7, an eighth switching element M8, a ninth switching element M9, a tenth switching element M10, a first capacitor C1, and a second capacitor C2.

The seventh and eighth switching elements M7 and M8 may be connected in series between the second node N2 and the first voltage VGH. The seventh switching element M7 may control a connection between the eighth switching element M8 and the second node N2 in response to the second clock signal ECLK2. The eighth switching element M8 may control a connection between the first voltage VGH and the second node N2 in response to a signal of the third node N3. The ninth switching element M9 may control a connection between the second clock signal ECLK2 and the fourth node N4 in response to the signal of the third node N3. The tenth switching element M10 may control a connection between the fourth node N4 and the first node N1 in response to the second clock signal ECLK2. The first capacitor C1 may be connected between the second clock signal ELCK2 and the second node N2, and the second capacitor C2 may be connected to the third node N3 and the fourth node N4.

Referring to FIGS. 1, 6, 7, and 8, the display device 1000 may be driven during a first frame F1 and a second frame F2 following the first frame F1. According to some example embodiments, the first partial panel area PPZ1 may be driven at the first driving frequency, and the second partial panel area PPZ2 may be driven at the second driving frequency smaller than the first driving frequency. For example, the first driving frequency may be about 120 Hz, and the second driving frequency may be about 60 Hz. In other words, each of the first and second frames F1 and F2 may have a time length of 1/120 second. In order to drive the first partial panel area PPZ1 at the first driving frequency of about 120 Hz, the emission control signals sequentially changed to the high level H during the first and second frames F1 and F2 may be provided to the first partial panel area PPZ1. In order to drive the second partial panel area PPZ2 at the second driving frequency of about 60 Hz, the emission control signals sequentially changed to the high level H during the first frame F1 may be provided to the second partial panel area PPZ2, and the emission control signals that do not change to the high level H during the second frame F2 may be provided to the second partial panel area PPZ2.

During the first frame F1, the emission start signal EFLM having the high level H may be provided to the first circuit stage EST[1]. In addition, the first and second clock signals ECLK1 and ECLK2, which toggle between the high level H and the low level L and have different phases, may be provided to the emission driver 200'. In addition, the first voltage VGH having the high level H and the second voltage VGL having the low level L may be provided to the emission driver 200'. Accordingly, the emission driver 200' may generate the emission control signals EM[1], EM[k−1], EM[k], and EM[n]. The emission control signals EM[1], EM[k−1], EM[k], and EM[n] may be sequentially changed to the high level H.

While the first partial area PPZ1 is driven of the second frame F2, the emission start signal EFLM having the high level H may be provided to the first circuit stage EST[1]. In addition, the first and second clock signals ECLK1 and ECLK2, which toggle between the high level H and the low level L and have different phases, may be provided to the first partial emission driver 210'. In addition, the first voltage VGH having the high level H and the second voltage VGL having the low level L may be provided to the first partial emission driver 210'. Accordingly, the first partial emission driver 210' may generate the first emission control signals EM[1] to EM[k−1]. The first emission control signals EM[1] to EM[k−1] may be sequentially changed to the high level H.

While the second partial panel area PPZ2 is driven of the second frame F2, the first and second clock signals ECLK1 and ECLK2 having the high level H may be provided to the second partial emission driver 220'. In addition, the first voltage VGH having the high level L and the third voltage VSW' having the same level as the first voltage VGH may be provided to the second partial emission driver 220'. Accordingly, the second partial emission driver 220' may generate the second emission control signals EM[k] to EM[n]. Because the first and second clock signals ECLK1 and ECLK2 have the high level H and the first and third voltages VGH and VSW' have the same level, the second emission control signals EM[k] to EM[n] may not be changed to the high level H.

Figure 9:
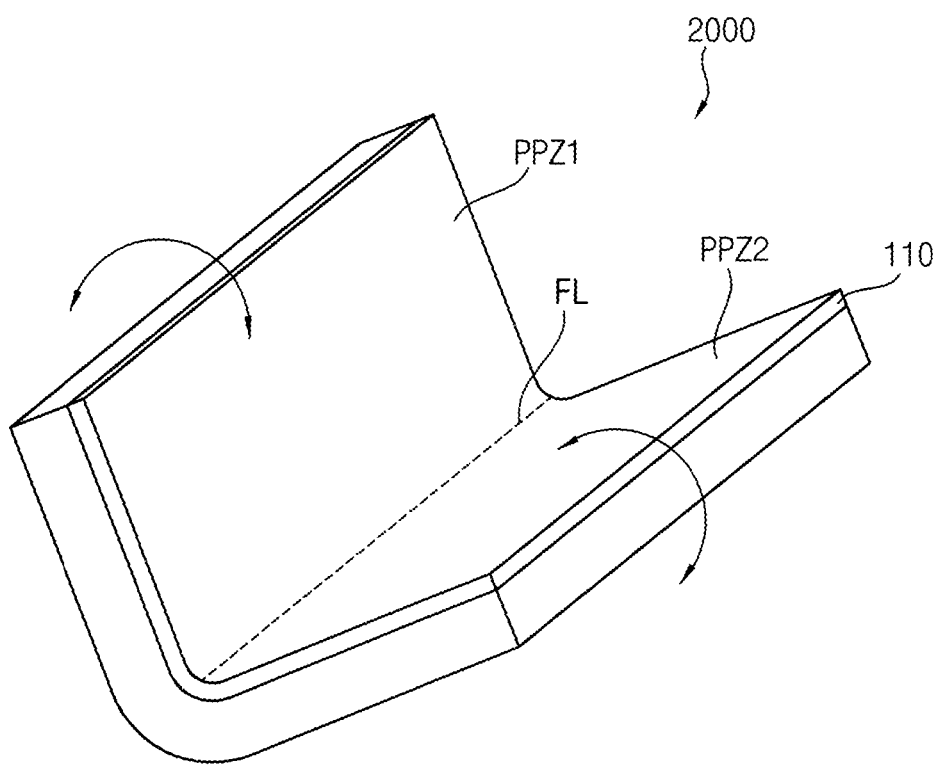
FIG. 9 is a perspective view illustrating a display device according to some example embodiments.
Figure 10:
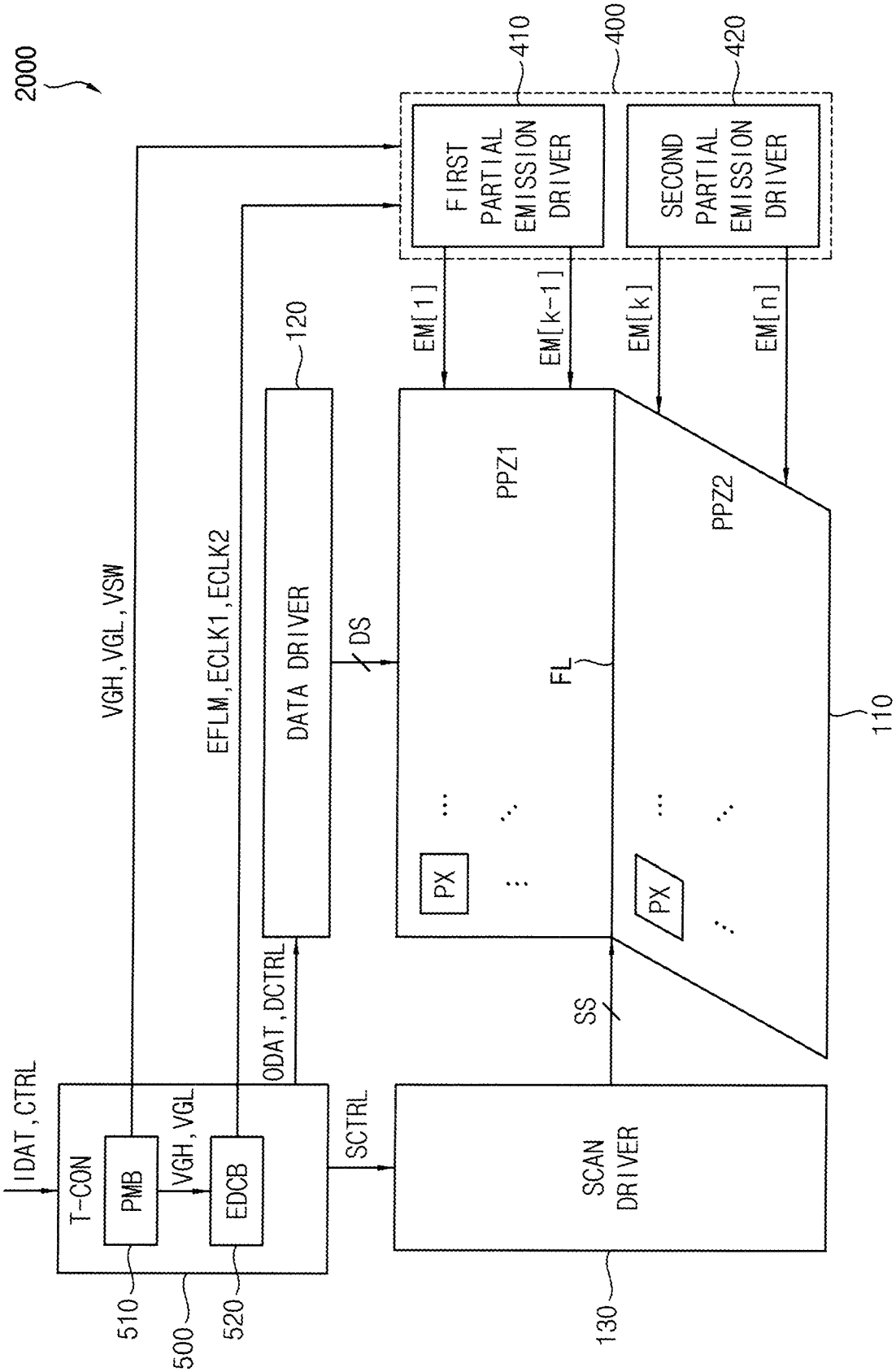
FIG. 10 is a block diagram illustrating a display device of FIG. 9 according to some example embodiments.
Figure 11:
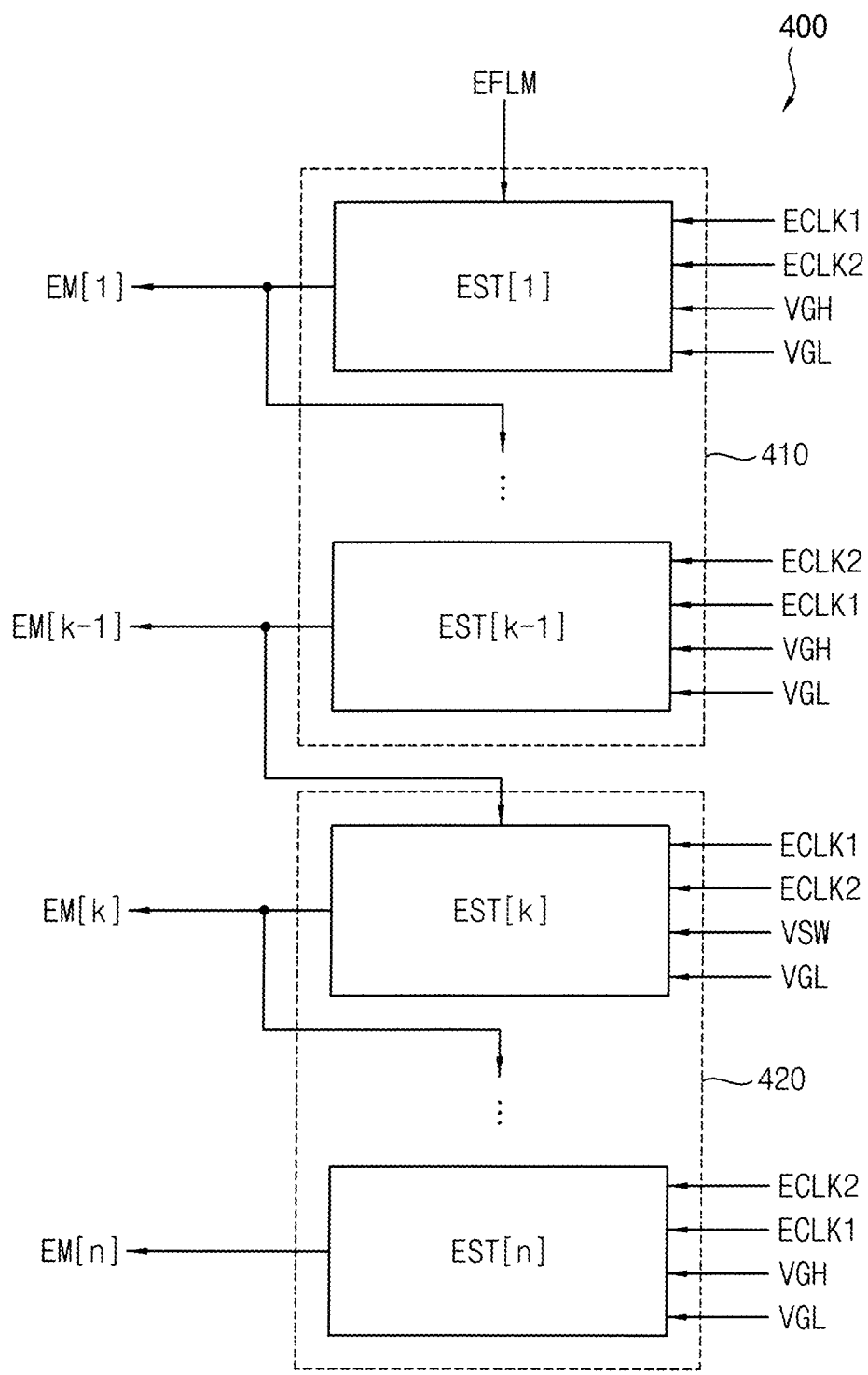
FIG. 11 is a block diagram illustrating an example of an emission driver included in the display device of FIG. 10 according to some example embodiments.
Figure 12:
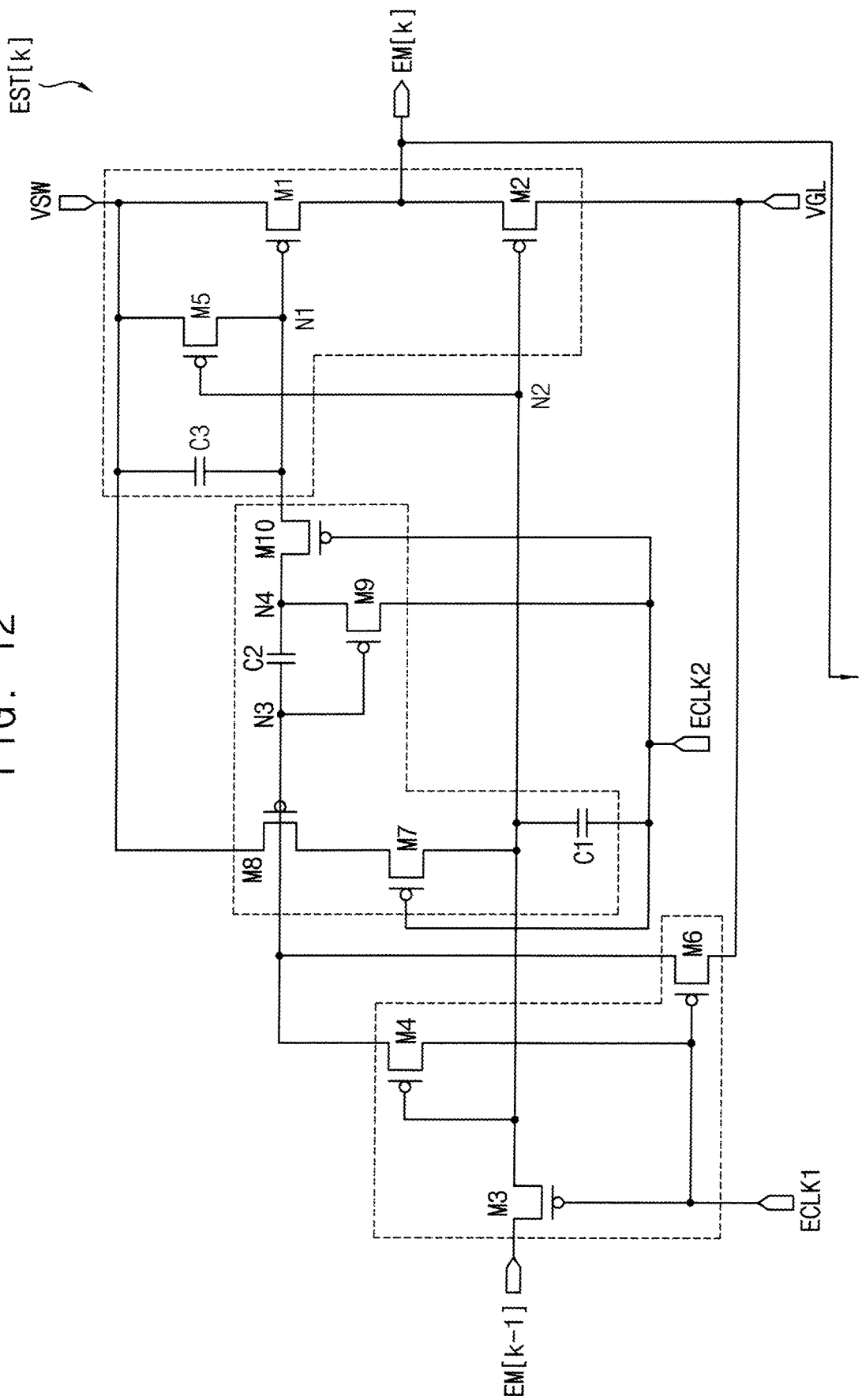
FIG. 12 is a circuit diagram illustrating a (k)-th circuit stage included in the emission driver of FIG. 11 according to some example embodiments.
Figure 13:
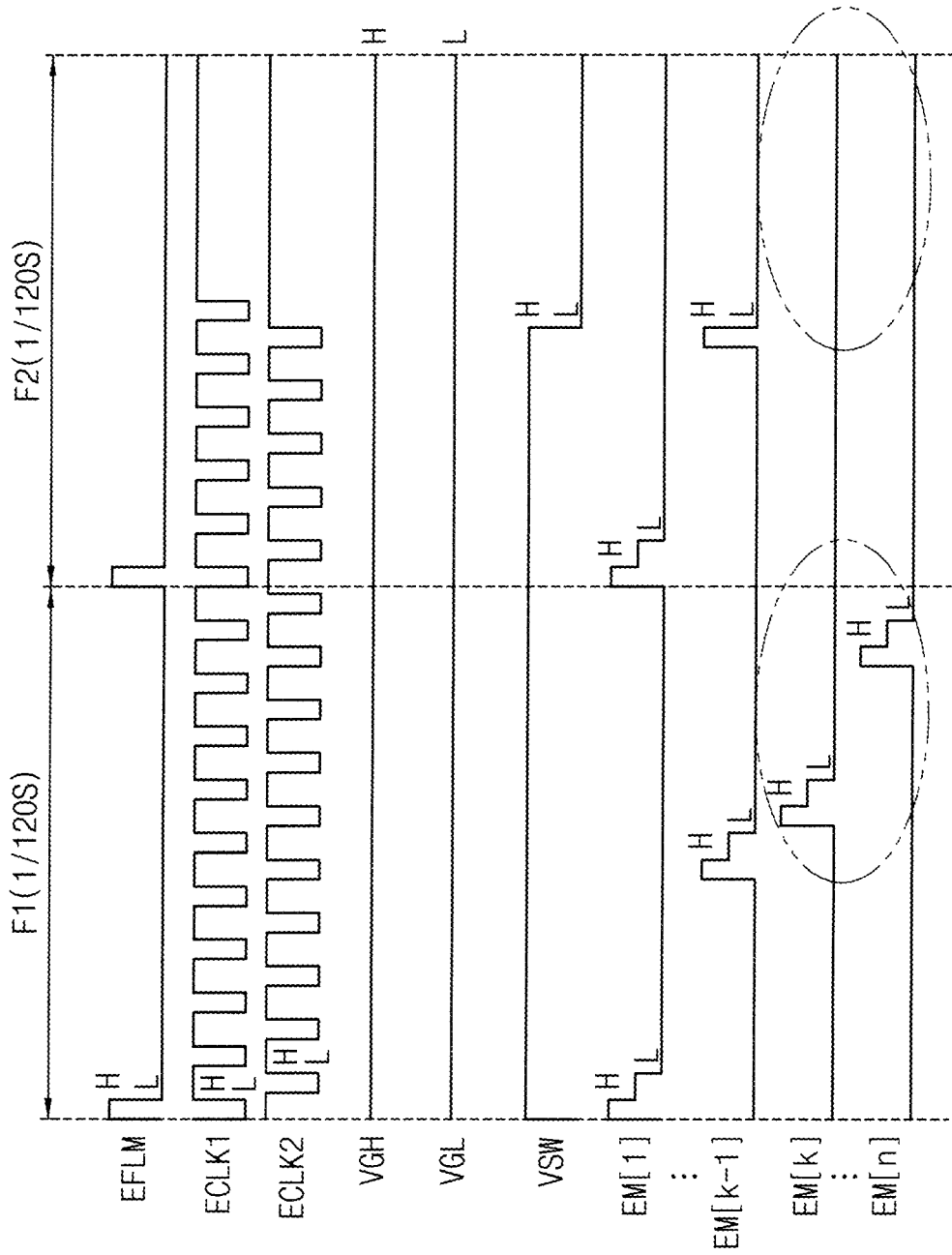
FIG. 13 is a waveform diagram illustrating a method of driving the emission driver of FIG. 11 according to some example embodiments.

FIG. 9 is a perspective view illustrating a display device according to some example embodiments. FIG. 10 is a block diagram illustrating a display device of FIG. 9. FIG. 11 is a block diagram illustrating an example of an emission driver included in the display device of FIG. 10. FIG. 12 is a circuit diagram illustrating a (k)-th circuit stage included in the emission driver of FIG. 11. FIG. 13 is a waveform diagram illustrating a method of driving the emission driver of FIG. 11.

Referring to FIGS. 9 and 10, a display device 2000 according to some example embodiments may be a foldable display device capable of repeatedly performing folding and unfolding in the folding line FL. A first partial panel area PPZ1 and a second partial panel area PPZ2 may be divided based on the folding line FL. Pixels PX located in the first partial panel area PPZ1 may be driven at a first driving frequency, and pixels PX located in the second partial panel area PPZ2 may be driven at a second driving frequency. When the display device 2000 is the foldable display device, it may be relatively frequent that the first partial panel area PPZ1 and the second partial panel area PPZ2 are driven at different driving frequencies. Accordingly, by providing a separate voltage only to a circuit stage that provides a emission control signal to a pixel row adjacent to the folding line FL, power consumption of the display device 2000 may be reduced.

According to some example embodiments, the display device 2000 may be an in-folding display device in which the display panel 110 is not exposed to the outside during folding. According to some example embodiments, the display device 2000 may be an out-folding display device in which the first partial panel area PPZ1 is exposed on a front surface and the second partial panel area PPZ2 is exposed on a rear surface during folding. In addition, the display device 2000 may be a flexible display device such as a curved display device, a bent display device, and a rollable display device. In addition, the display device 2000 may be a rigid display device.

The display device 2000 may include the display panel 110, a data driver 120, a scan driver 130, an emission driver 400, and a controller 500. However, because the display panel 110, the data driver 120, and the scan driver 130 of the display device 2000 is a substantially same as the display panel 110, the data driver 120, and the scan driver 130 described with reference to FIG. 1, some repetitive description thereof may be omitted below.

The emission driver 400 may generate emission control signals EM[1], EM[k−1], EM[k], and EM[n] based on a first voltage VGH, a second voltage VGL, a third voltage VSW, an emission start signal EFLM, a first clock signal ECLK1, and a second clock signal ECLK2 which are received from the controller 300. In addition, the emission driver 400 may provide the emission control signals EM[1], EM[k−1], EM[k], and EM[n] to the pixels PX through an emission lines located in the display panel 110. According to some example embodiments, the emission driver 400 may sequentially provide the emission control signals EM[1], EM[k−1], EM[k], and EM[n] to the pixels PX in a row unit. For example, the emission driver 400 may be integrated or formed in a peripheral portion of the display panel 110.

According to some example embodiments, the emission driver 400 may include a first partial emission driver 410 and a second partial emission driver 420. The emission control signals EM[1], EM[k−1], EM[k], and EM[n] may include first emission control signals EM[1] to EM[k−1] and the second emission control signals EM[k] to EM[n]. For example, the first partial emission driver 410 may provide the first emission control signals EM[1] to EM[k−1] to the first partial panel area PPZ1 of the display panel 110. The second partial emission driver 420 may provide the second emission control signals EM[k] to EM[n] to the second partial panel area PPZ2 of the display panel 110.

The controller 500 may receive an input image data IDAT and a control signal CTRL from an external device. According to some example embodiments, the control signal CTRL may include a vertical synchronization signal, a horizontal synchronization signal, an input data enable signal, a master clock signal, and the like. The controller 500 may generate the output image data ODAT, the data control signal DCTRL, the scan control signal SCTRL, the first voltage VGH, the second voltage VGL, the third voltage VSW, the emission start signal EFLM, the first clock signal ECLK1, and the second clock signal ECLK2 based on the input image data IDAT and the control signal CTRL.

The power management block 510 may provide the first voltage VGH having the high level H and the second voltage VGL having the low level L to circuit stages in the first partial emission driver 410 while the first partial emission driver 410 generates the first emission control signals EM[1] to EM[k−1]. In addition, the power management block 510 may provide the third voltage VSW having the low level L and the second voltage VGL having a same level as the third voltage VSW to a first circuit stage in the second partial emission driver 420 while the second partial emission driver 420 generates the second emission control signals EM[k] to EM[n]. In addition, the power management block 510 may provide the first voltage VGH and the second voltage VGL to remaining circuit stages in the second partial emission driver 420 (i.e., a second circuit stage to a last circuit stage among the circuit stages in the second partial emission driver 420) while the second partial emission driver 420 generates the second emission control signals EM[k] to EM[n]. In addition, the power management block 510 may provide the first voltage VGH and the second voltage VGL to the emission control block 520.

The emission control block 520 may receive the first and second voltages VGH and VGL from the power management block 510, and may provide the first clock signal ECLK1 and the second clock signal ECLK2 based on the first and second voltages VGH and VGL to the emission driver 200.

For example, the emission control block 520 may provide the first and second clock signals ECLK1 and ECLK2 to the emission driver 400 while the first partial emission driver 410 generates the first emission control signals EM[1] to EM[k−1]. In this case, the first and second clock signals ECLK1 and ECLK2 may toggle between the high level H and the low level L and may have different phases each other. In addition, the emission control block 520 may provide the first and second clock signals ECLK1 and ECLK2 to the emission driver 400 while the second partial emission driver 420 generates the second emission control signals EM[k] to EM[n]. In this case, the first and second clock signals ECLK1 and ECLK2 may have the high level H.

Referring to FIG. 11, the emission driver 400 may include a plurality of circuit stages. The circuit stages may be dependently connected to each other to sequentially provide the emission control signals in row units. For example, the first partial emission driver 410 may include a first circuit stages EST[1] to EST[k−1], and the second partial emission driver 420 may include a second circuit stages EST[k] to EST[n].

According to some example embodiments, while the first partial emission driver 410 generates the first emission control signals EM[1] to EM[k−1], the first voltage VGH having the high level H and the second voltage VGL having the low level L may be provided to the first circuit stages EST[1] to EST[k−1]. In addition, while the second partial emission driver 420 generates the second emission control signals EM[k] to EM[n], the third voltage VSW having the low level L and a second voltage VGL having a same level as the third voltage VSW may be provided to the first circuit stage EST[k] among the second circuit stages EST[k] to EST[n]. In addition, the first voltage VGH and the second voltage VGL may be provided to the remaining circuit stages among the second circuit stages EST[k] to EST[n].

For example, a first circuit stage EST[1] among the first circuit stages EST[1] to EST[k−1] may generate an emission control signal EM[1] by receiving the emission start signal EFLM, the first clock signal ECLK1, the second clock signal ECLK2, the first voltage VGH, and the second voltage VGL. The emission control signal EM[1] may be provided to pixels located in a first pixel row (e.g., a first pixel row among pixel rows of the display panel 110) and may be provided to a next circuit stage.

A last circuit stage EST[k−1] among the first circuit stages EST[1] to EST[k−1] may generate an emission control signal EM[k−1] by receiving an emission control signal from a previous circuit stage, the second clock signal ECLK2, the first clock signal ECLK1, the first voltage VGH, and the second voltage VGL. The emission control signal EM[k−1] may be provided to pixels located in a (k−1)-th pixel row and may be provided to a next circuit stage EST[k].

A first circuit stage EST[k] among the second circuit stages EST[k] to EST[n] may generate an emission control signal EM[k] by receiving the emission control signal EM[k−1] from a previous circuit stage, the first clock signal ECLK1, the second clock signal ECLK2, the third voltage VSW, and the second voltage VGL. The emission control signal EM[k] may be provided to pixels located in a (k)-th pixel row and may be provided to a next circuit stage.

A last circuit stage EST[n] among the second circuit stages EST[k] to EST[n] may generate an emission control signal EM[n] by receiving an emission control signal from a previous circuit stage, the second clock signal ECLK2, the first clock signal ECLK1, the first voltage VGH, and the second voltage VGL. The emission control signal EM[n] may be provided to pixels located in a (n)-th pixel row.

Referring to FIG. 12, the first circuit stage EST[k] among the second circuit stages EST[k] to EST[n] may output the (k)-th emission control signal EM[k] by receiving the emission control signal EM[k−1] of the previous circuit stage, the third voltage VSW, the second voltage VGL, the first clock signal ECLK1, and the second clock signal ECLK2. However, the circuit configuration of the first circuit stage EST[k] may be substantially the same as the circuit configuration of the (k)-th circuit stage EST[k] described with reference to FIG. 4.

Referring to FIGS. 10, 11, 12, and 13, the display device 2000 may be driven during a first frame F1 and a second frame F2 following the first frame F1. According to some example embodiments, the first partial panel area PPZ1 may be driven at the first driving frequency, and the second partial panel area PPZ2 may be driven at the second driving frequency smaller than the first driving frequency. For example, the first driving frequency may be about 120 Hz, and the second driving frequency may be about 60 Hz. In other words, each of the first and second frames F1 and F2 may have a time length of 1/120 second. In order to drive the first partial panel area PPZ1 at the first driving frequency of about 120 Hz, the emission control signals sequentially changed to the high level H during the first and second frames F1 and F2 may be provided to the first partial panel area PPZ1. In order to drive the second partial panel area PPZ2 at the second driving frequency of about 60 Hz, the emission control signals sequentially changed to the high level H during the first frame F1 may be provided to the second partial panel area PPZ2, and the emission control signals that do not change to the high level H during the second frame F2 may be provided to the second partial panel area PPZ2.

During the first frame F1, the emission start signal EFLM having the high level H may be provided to the first circuit stage EST[1] among the first circuit stages EST[1] to EST[k−1]. In addition, the first and second clock signals ECLK1 and ECLK2, which toggle between the high level H and the low level L and have different phases, may be provided to the emission driver 400. In addition, the first voltage VGH having the high level H and the second voltage VGL having the low level L may be provided to the emission driver 400. Accordingly, the emission driver 400 may generate the emission control signals EM[1], EM[k−1], EM[k], and EM[n]. The emission control signals EM[1], EM[k−1], EM[k], and EM[n] may be sequentially changed to the high level H.

While the first partial area PPZ1 is driven of the second frame F2, the emission start signal EFLM having the high level H may be provided to the first circuit stage EST[1] among the first circuit stages EST[1] to EST[k−1]. In addition, the first and second clock signals ECLK1 and ECLK2, which toggle between the high level H and the low level L and have different phases, may be provided to the first partial emission driver 410. In addition, the first voltage VGH having the high level H and the second voltage VGL having the low level L may be provided to the first partial emission driver 410. Accordingly, the first partial emission driver 410 may generate the first emission control signals EM[1] to EM[k−1]. The first emission control signals EM[1] to EM[k−1] may be sequentially changed to the high level H.

While the second partial panel area PPZ2 is driven of the second frame F2, the first and second clock signals ECLK1 and ECLK2 having the high level H may be provided to the second partial emission driver 420. In addition, the third voltage VSW having the low level L and the second voltage VGL having the same level as the third voltage VSW may be provided to the second partial emission driver 420. Accordingly, the second partial emission driver 420 may generate the second emission control signals EM[k] to EM[n]. Because the first and second clock signals ECLK1 and ECLK2 have the high level H and the third and second voltages VSW and VGL have the same level, the emission control signals EM[k] may not be changed to the high level H. Because the emission control signal EM[k] is not changed to the high level H, the emission control signal generated by the remaining circuit stages among the second circuit stages EST[k] to EST[n] may not be changed to the high level H.

Figure 14:
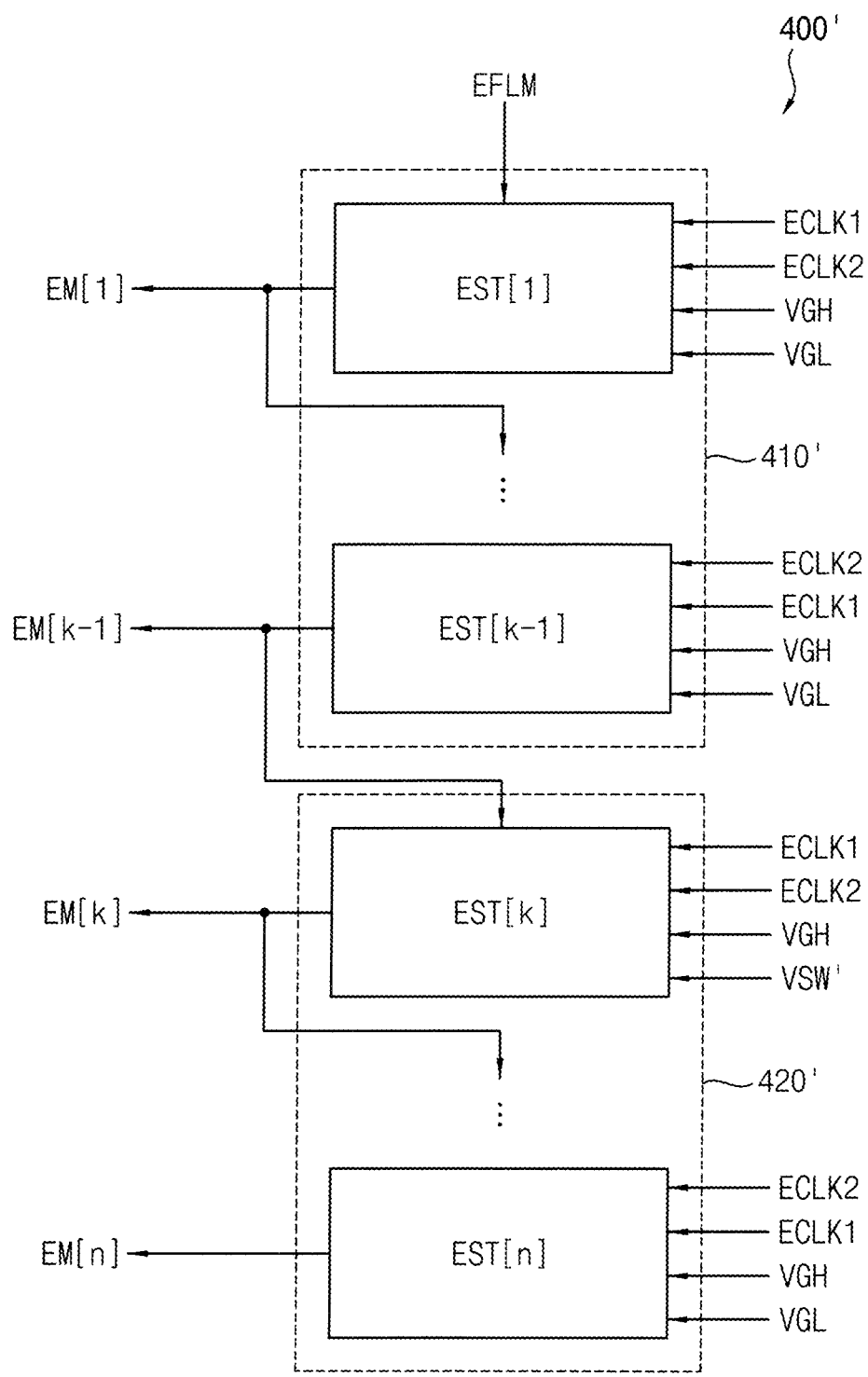
FIG. 14 is a block diagram illustrating another example of an emission driver included in the display device of FIG. 10 according to some example embodiments.
Figure 15:
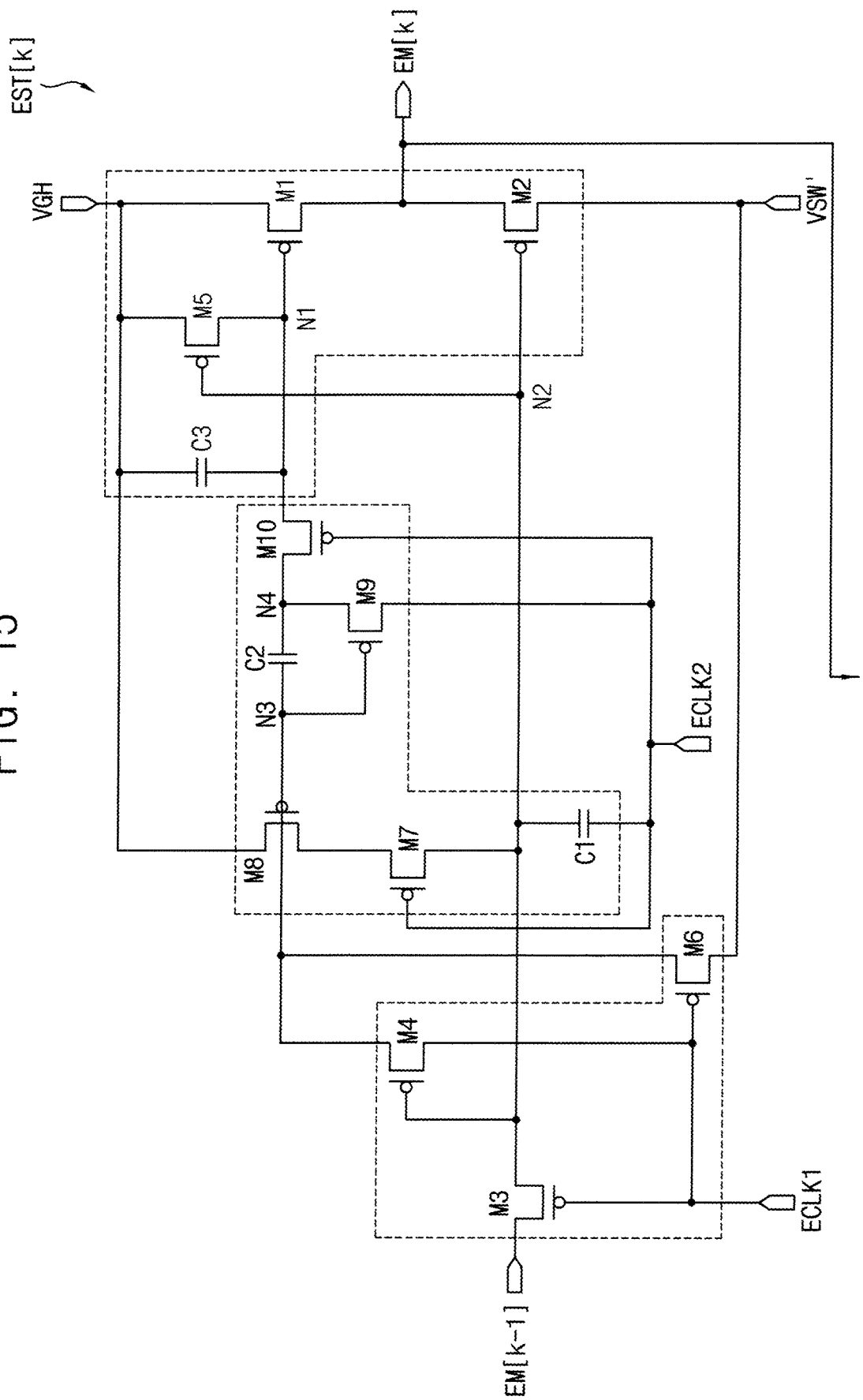
FIG. 15 is a circuit diagram illustrating a first circuit stage in a second partial emission driver included in the emission driver of FIG. 14 according to some example embodiments.
Figure 16:
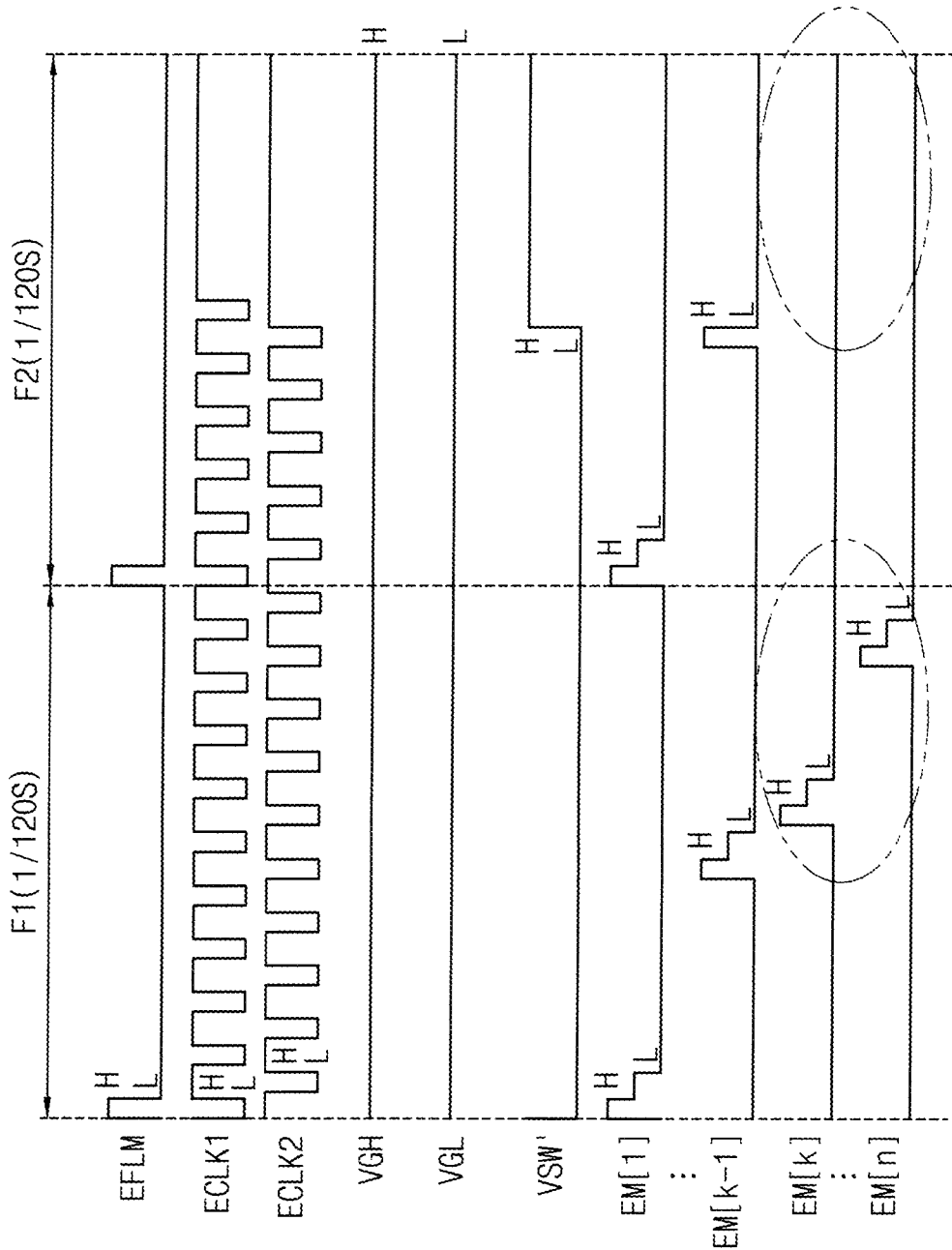
FIG. 16 is a waveform diagram illustrating a method of driving the emission driver of FIG. 14 according to some example embodiments.

FIG. 14 is a block diagram illustrating another example of an emission driver included in the display device of FIG. 10. FIG. 15 is a circuit diagram illustrating a first circuit stage in a second partial emission driver included in the emission driver of FIG. 14. FIG. 16 is a waveform diagram illustrating a method of driving the emission driver of FIG. 14.

Referring to FIG. 14, an emission driver 400' may include a plurality of circuit stages. The circuit stages may be dependently connected to each other to sequentially provide emission control signals in row units. For example, a first partial emission driver 410' may include first circuit stages EST[1] to EST[k−1], and a second partial emission driver 420' may include second circuit stages EST[k] to EST[n].

A first circuit stage EST[1] among the first circuit stages EST[1] to EST[k−1] may generate an emission control signal EM[1] by receiving the emission start signal EFLM, the first clock signal ECLK1, the second clock signal ECLK2, the first voltage VGH, and the second voltage. The emission control signal EM[1] may be provided to pixels located in a first pixel row (e.g., a first pixel row among pixel rows of the display panel 110) and may be provided to a next circuit stage.

A last circuit stage EST[k−1] among the first circuit stages EST[1] to EST[k−1] may generate an emission control signal EM[k−1] by receiving an emission control signal from a previous circuit stage, the second clock signal ECLK2, the first clock signal ECLK1, the first voltage VGH, and the second voltage VGL. The emission control signal EM[k−1] may be provided to pixels located in a (k−1)-th pixel row and may be provided to a first circuit stage EST[k] among the second circuit stages EST[k] to EST[n]

A first circuit stage EST[k] among the second circuit stages EST[k] to EST[n] may generate an emission control signal EM[k] by receiving the emission control signal EM[k−1] from a previous circuit stage, the first clock signal ECLK1, the second clock signal ECLK2, the first voltage VGH, and a third voltage VSW'. The emission control signal EM[k] may be provided to pixels located in a (k)-th pixel row and may be provided to a next circuit stage.

A last circuit stage EST[n] among the second circuit stages EST[k] to EST[n] may generate an emission control signal EM[n] by receiving an emission control signal from a previous circuit stage, the second clock signal ECLK2, the first clock signal ECLK1, the first voltage VGH, and the second voltage VGL. The emission control signal EM[n] may be provided to pixels located in a (n)-th pixel row.

Referring to FIG. 15, the first circuit stage EST[k] among the second circuit stages EST[k] to EST[n] may output the emission control signal EM[k] by receiving the emission control signal EM[k−1], the first voltage VGH, the third voltage VSW', the first clock signal ECLK1, and the second clock signal ECLK2. However, the circuit configuration of the first circuit stage EST[k] may be substantially the same as the circuit configuration of the (k)-th circuit stage EST[k] described with reference to FIG. 7.

Referring to FIGS. 14, 15, and 16, the display device 2000 may be driven during a first frame F1 and a second frame F2 following the first frame F1. According to some example embodiments, the first partial panel area PPZ1 may be driven at the first driving frequency, and the second partial panel area PPZ2 may be driven at the second driving frequency smaller than the first driving frequency. For example, the first driving frequency may be about 120 Hz, and the second driving frequency may be about 60 Hz. In other words, each of the first and second frames F1 and F2 may have a time length of 1/120 second. In order to drive the first partial panel area PPZ1 at the first driving frequency of about 120 Hz, the emission control signals sequentially changed to the high level H during the first and second frames F1 and F2 may be provided to the first partial panel area PPZ1. In order to drive the second partial panel area PPZ2 at the second driving frequency of about 60 Hz, the emission control signals sequentially changed to the high level H during the first frame F1 may be provided to the second partial panel area PPZ2, and the emission control signals that do not change to the high level H during the second frame F2 may be provided to the second partial panel area PPZ2.

During the first frame F1, the emission start signal EFLM having the high level H may be provided to the first circuit stage EST[1] among the first circuit stages EST[1] to EST[k−1]. In addition, the first and second clock signals ECLK1 and ECLK2, which toggle between the high level H and the low level L and have different phases, may be provided to the emission driver 400'. In addition, the first voltage VGH having the high level H and the second voltage VGL having the low level L may be provided to the emission driver 400. Accordingly, the emission driver 400' may generate the emission control signals EM[1], EM[k−1], EM[k], and EM[n]. The emission control signals EM[1], EM[k−1], EM[k], and EM[n] may be sequentially changed to the high level H.

While the first partial area PPZ1 is driven of the second frame F2, the emission start signal EFLM having the high level H may be provided to the first circuit stage EST[1] among the first circuit stages EST[1] to EST[k−1]. In addition, the first and second clock signals ECLK1 and ECLK2, which toggle between the high level H and the low level L and have different phases, may be provided to the first partial emission driver 410'. In addition, the first voltage VGH having the high level H and the second voltage VGL having the low level L may be provided to the first partial emission driver 410'. Accordingly, the first partial emission driver 410' may generate the first emission control signals EM[1] to EM[k−1]. The first emission control signals EM[1] to EM[k−1] may be sequentially changed to the high level H.

While the second partial panel area PPZ2 is driven of the second frame F2, the first and second clock signals ECLK1 and ECLK2 having the high level H may be provided to the second partial emission driver 420'. In addition, the first voltage VGH having the high level H and the third voltage VSW' having a same level as the first voltage VGH may be provided to the first circuit stage EST[k] among the second circuit stages EST[k] to EST[n]. Accordingly, the second partial emission driver 420' may generate the second emission control signals EM[k] to EM[n]. Because the first and second clock signals ECLK1 and ECLK2 have the high level H and the first and third voltages VGH and VSW' have the same level, the emission control signals EM[k] may not be changed to the high level H. Because the emission control signal EM[k] is not changed to the high level H, the emission control signal generated by the remaining circuit stages among the second circuit stages EST[k] to EST[n] may not be changed to the high level H.

Although aspects of some example embodiments and implementations have been described herein, other embodiments and modifications will be apparent from this description. Accordingly, the inventive concepts are not limited to the example embodiments described herein, but rather to the broader scope of the appended claims and their equivalents and various obvious modifications and equivalent arrangements as would be apparent to a person of ordinary skill in the art.

What is claimed is:

1. A display device comprising:
a display panel including a plurality of pixels;
an emission driver including a first partial emission driver and a second partial emission driver, wherein the first partial emission driver is configured to provide first emission control signals to a first partial panel area of the display panel on a first side of a folding line, and wherein the second partial emission driver is configured to provide second emission control signals to a second partial panel area of the display panel on a second side of the folding line;
a controller configured to control the emission driver, wherein the controller comprises:
a power management block configured to:
provide a first voltage having a high level and a second voltage having a low level to the emission driver, in response to the first partial emission driver generating the first emission control signals; and
provide a third voltage and a fourth voltage, having a same level as the third voltage, to the emission driver in response to the second partial emission driver generating the second emission control signals; and
an emission control block configured to receive the first voltage and the second voltage from the power management block and to provide a first clock signal and a second clock signal to the emission driver based on the first and second voltages.

2. The display device of claim 1, wherein a first driving frequency of the first partial panel area is greater than a second driving frequency of the second partial panel area.

3. The display device of claim 1, wherein the third voltage and the fourth voltage have the low level.

4. The display device of claim 1, wherein the third voltage and the fourth voltage have the high level.

5. The display device of claim 1, wherein the emission control block is configured to provide an emission start signal having the high level to the emission driver,
wherein the first emission control signals are sequentially changed to the high level, and
wherein the second emission control signals are not changed to the high level.

6. The display device of claim 1, wherein the emission control block is configured to provide the first and second clock signals having the high level to the emission driver in response to the second partial emission driver generating the second emission control signals.

7. The display device of claim 6, wherein the emission control block is configured to provide the first and second clock signals to the emission driver in response to the first partial emission driver generating the first emission control signals, and
wherein the first and second clock signals toggle between the high level and the low level and have different phases from each other.

8. The display device of claim 1, wherein the second partial emission driver includes a plurality of circuit stages, wherein at least one circuit stages comprises:
a first switching element configured to transmit the third voltage to an output terminal in response to a signal of a first node; and
a second switching element configured to transmit the fourth voltage to the output terminal in response to a signal of a second node, and
wherein the output terminal is configured to output the second emission control signals.

9. The display device of claim 8, wherein at least one of the circuit stages further comprises a third switching element configured to transmit the first emission control signals to the second node in response to the first clock signal.

10. The display device of claim 8, wherein at least one circuit stages further comprises a fourth switching element configured to transmit the third voltage to the first node in response to the signal of the second node.

11. The display device of claim 1, wherein
the first partial panel area and the second partial panel area are divided based on the folding line, and
the display panel is configured to fold in the folding line.

12. A display device comprising:
a display panel including a plurality of pixels;
an emission driver including a first partial emission driver and a second partial emission driver, wherein the first partial emission driver is configured to provide first emission control signals to a first partial panel area of the display panel on a first side of a folding line, and wherein the second partial emission driver is configured to provide second emission control signals to a second partial panel area of the display panel one a second side of the folding line; and
a controller configured to control the emission driver, wherein the first partial emission driver comprises a plurality of first circuit stages, wherein the second partial emission driver comprises a plurality of second circuit stages, and
wherein the controller comprises:
a power management block configured to:
provide a first voltage having a high level and a second voltage having a low level to the first circuit stages in response to the first partial emission driver generating the first emission control signals;
provide a third voltage and a fourth voltage, having a same level as the third voltage, to a first circuit stage among the second circuit stages in response to the second partial emission driver generating the second emission control signals; and
provide the first voltage and the second voltage to other circuit stages among the second circuit stages in response to the second partial emission driver generating the second emission control signals; and
an emission control block configured to receive the first voltage and the second voltage from the power management block and to provide a first clock signal and a second clock signal to the emission driver based on the first and second voltages.

13. The display device of claim 12, wherein a first driving frequency of the first partial panel area is greater than a second driving frequency of the second partial panel area.

14. The display device of claim 13, wherein
the first partial panel area and the second partial panel area are divided based on the folding line, and
the display panel is configured to fold in the folding line.

15. The display device of claim 12, wherein the third voltage and the fourth voltage have the low level.

16. The display device of claim 12, wherein the third voltage and the fourth voltage have the high level.

17. The display device of claim 12, wherein the emission control block is configured to provide an emission start signal having the high level to the emission driver,
wherein the first emission control signals are sequentially changed to the high level, and
wherein the second emission control signals are not changed to the high level.

18. The display device of claim 12, wherein the emission control block is configured to provide the first and second clock signals having the high level to the emission driver in response to the second partial emission driver generating the second emission control signals.

19. The display device of claim 18, wherein the emission control block is configured to provide the first and second clock signals to the emission driver in response to the first partial emission driver generating the first emission control signals, and
wherein the first and second clock signals toggle between the high level and the low level and have different phases each other.

20. The display device of claim 12, wherein the first circuit stage among the second circuit stages comprises:
a first switching element configured to transmit the third voltage to an output terminal in response to a signal of a first node; and
a second switching element configured to transmit the fourth voltage to the output terminal in response to a signal of a second node,
wherein the output terminal is configured to output the second emission control signals.

21. The display device of claim 20, wherein the first circuit stage among the second circuit stages further comprises a third switching element configured to transmit the first emission control signals to the second node in response to the first clock signal.

22. The display device of claim 21, wherein the first circuit stage among the second circuit stages further comprises a fourth switching element configured to transmit the third voltage to the first node in response to the signal of the second node.

* * * * *